(12) United States Patent
Chen et al.

(10) Patent No.: US 10,804,401 B2
(45) Date of Patent: Oct. 13, 2020

(54) STRUCTURE AND METHOD FOR FINFET DEVICE WITH CONTACT OVER DIELECTRIC GATE

(71) Applicant: Taiwan Semiconductor Manufacturing Co., Ltd., Hsin-Chu (TW)

(72) Inventors: Fang Chen, Hsinchu (TW); Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/734,968

(22) Filed: Jan. 6, 2020

(65) Prior Publication Data

US 2020/0152782 A1    May 14, 2020

Related U.S. Application Data

(62) Division of application No. 15/993,970, filed on May 31, 2018, now Pat. No. 10,529,860.

(51) Int. Cl.
*H01L 27/115* (2017.01)
*H01L 29/78* (2006.01)
(Continued)

(52) U.S. Cl.
CPC ........ *H01L 29/785* (2013.01); *H01L 21/3212* (2013.01); *H01L 21/7684* (2013.01);
(Continued)

(58) Field of Classification Search
CPC ..... H01L 21/823431; H01L 21/823821; H01L 27/0924; H01L 29/41791
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| KR | 20130086104 | 7/2013 |
| KR | 20160028991 | 3/2016 |
| KR | 101810319 | 12/2017 |

*Primary Examiner* — George R Fourson, III
(74) *Attorney, Agent, or Firm* — Haynes and Boone, LLP

(57) ABSTRACT

The present disclosure provides one embodiment of a semiconductor structure. The semiconductor structure includes a first active region and a second fin active region extruded from a semiconductor substrate; an isolation featured formed in the semiconductor substrate and being interposed between the first and second fin active regions; a dielectric gate disposed on the isolation feature; a first gate stack disposed on the first fin active region and a second gate stack disposed on the second fin active region; a first source/drain feature formed in the first fin active region and interposed between the first gate stack and the dielectric gate; a second source/drain feature formed in the second fin active region and interposed between the second gate stack and the dielectric gate; a contact feature formed in a first inter-level dielectric material layer and landing on the first and second source/drain features and extending over the dielectric gate.

20 Claims, 32 Drawing Sheets

(51) Int. Cl.
*H01L 21/321* (2006.01)
*H01L 29/45* (2006.01)
*H01L 29/40* (2006.01)
*H01L 29/417* (2006.01)
*H01L 21/8234* (2006.01)
*H01L 29/66* (2006.01)
*H01L 21/762* (2006.01)
*H01L 21/768* (2006.01)
*H01L 27/088* (2006.01)
*H01L 23/528* (2006.01)
*H01L 23/522* (2006.01)
*H01L 29/423* (2006.01)
*H01L 29/165* (2006.01)
*H01L 29/49* (2006.01)
*H01L 29/51* (2006.01)
*H01L 23/532* (2006.01)
*H01L 21/3105* (2006.01)
*H01L 21/311* (2006.01)

(52) U.S. Cl.
CPC .. *H01L 21/76224* (2013.01); *H01L 21/76816* (2013.01); *H01L 21/76843* (2013.01); *H01L 21/76852* (2013.01); *H01L 21/76895* (2013.01); *H01L 21/823431* (2013.01); *H01L 21/823475* (2013.01); *H01L 21/823481* (2013.01); *H01L 23/528* (2013.01); *H01L 23/5221* (2013.01); *H01L 23/5226* (2013.01); *H01L 23/5283* (2013.01); *H01L 27/0886* (2013.01); *H01L 29/401* (2013.01); *H01L 29/41791* (2013.01); *H01L 29/456* (2013.01); *H01L 29/6656* (2013.01); *H01L 29/66545* (2013.01); *H01L 29/66795* (2013.01); *H01L 29/7851* (2013.01); *H01L 21/31053* (2013.01); *H01L 21/31111* (2013.01); *H01L 21/76819* (2013.01); *H01L 21/76871* (2013.01); *H01L 23/53214* (2013.01); *H01L 23/53223* (2013.01); *H01L 23/53238* (2013.01); *H01L 23/53266* (2013.01); *H01L 29/165* (2013.01); *H01L 29/42364* (2013.01); *H01L 29/45* (2013.01); *H01L 29/4966* (2013.01); *H01L 29/513* (2013.01); *H01L 29/517* (2013.01); *H01L 29/518* (2013.01); *H01L 29/665* (2013.01); *H01L 29/66636* (2013.01); *H01L 29/7848* (2013.01); *H01L 2029/7858* (2013.01)

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,893,207 | B1 | 2/2018 | Balakrishnan et al. |
| 2015/0004192 | A1 | 2/2015 | Moroz |
| 2016/0233133 | A1 | 8/2016 | Liu et al. |
| 2017/0154966 | A1* | 6/2017 | Huang ............ H01L 21/823481 |
| 2017/0154967 | A1* | 6/2017 | Huang ............ H01L 21/76895 |
| 2019/0013314 | A1* | 1/2019 | Choi ............... H01L 21/823431 |

* cited by examiner

STRUCTURE AND METHOD FOR FINFET DEVICE WITH CONTACT OVER DIELECTRIC GATE

The present application is a divisional application of U.S. Ser. No. 15/993,970, filed May 31, 2018, which is hereby incorporated by reference in its entirety.

BACKGROUND

Integrated circuits have progressed to advanced technologies with smaller feature sizes, such as 16 nm, 9 nm and 7 nm. In these advanced technologies, the devices (such as transistors) shrink and therefore induce various issues, such as contact to gate bridging concern. Furthermore, three dimensional transistors with fin active regions are often desired for enhanced device performance. Those three dimensional field effect transistors (FETs) formed on fin active regions are also referred to as FinFETs. FinFETs are desired to have narrow fin width for short channel control, which leads to smaller S/D regions than those of planar FETs. This will further degrade the contact to S/D landing margin. Along with the scaling down of the device sizes, the contact size was continuously shrunk for high-density gate pitch requirement. To shrink the contact size without impacting contact resistance, there are challenges including material integration, processing and designing constrains. Other concerns include line-end shortening and line-end to line-end bridging, leading to either contact-to-fin active connection opening or contact-to-contact leakage (bridging). To reduce the line end shortening, it requires a wider space rule or more aggressive reshaping by optical proximity correction (OPC) on the line end, which will impact the cell size or cause bridging in a given cell pitch. This is getting even worse on fin transistors because fin active regions are very narrow. Especially, in the logic circuits or memory circuits, some local interconnection features are desired to have better interconnection without losing the circuit density. Therefore, there is a need for a structure and method for fin transistors and contact structure to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
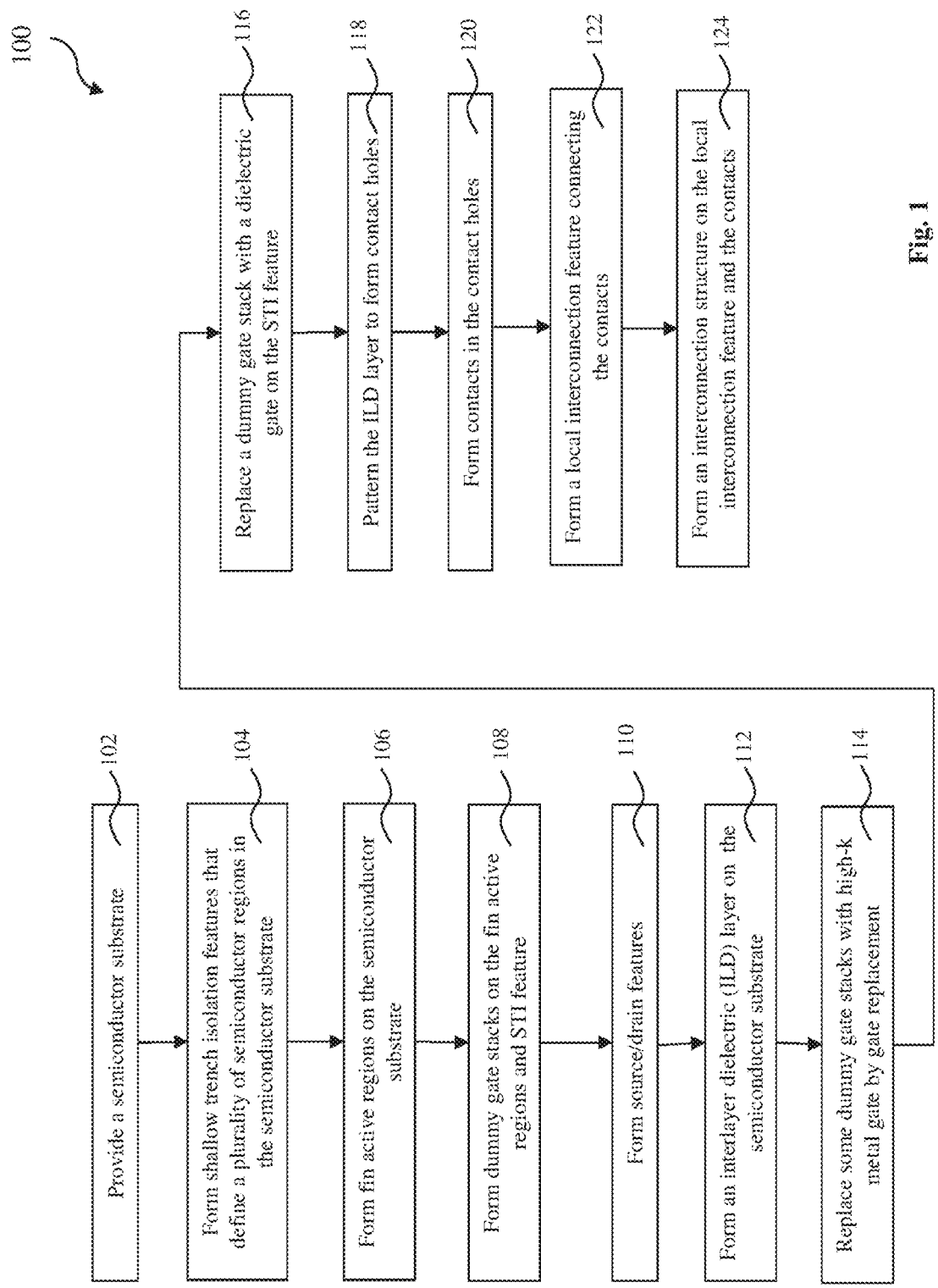
FIG. 1 is a flowchart of a method making a semiconductor structure constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart 100 for fabricating a semiconductor structure 200 having transistors and a local interconnection feature coupling the adjacent transistors constructed according to some embodiments. FIGS. 2A-12B are top or sectional views of the semiconductor structure 200 at various fabrication stages. In the present embodiment, the semiconductor structure 200 includes fin transistors and a local interconnection feature coupling the adjacent transistors. The semiconductor structure 200 and the method 100 making the same are collectively described below with reference to FIGS. 1 through 15.

Figure 2A:
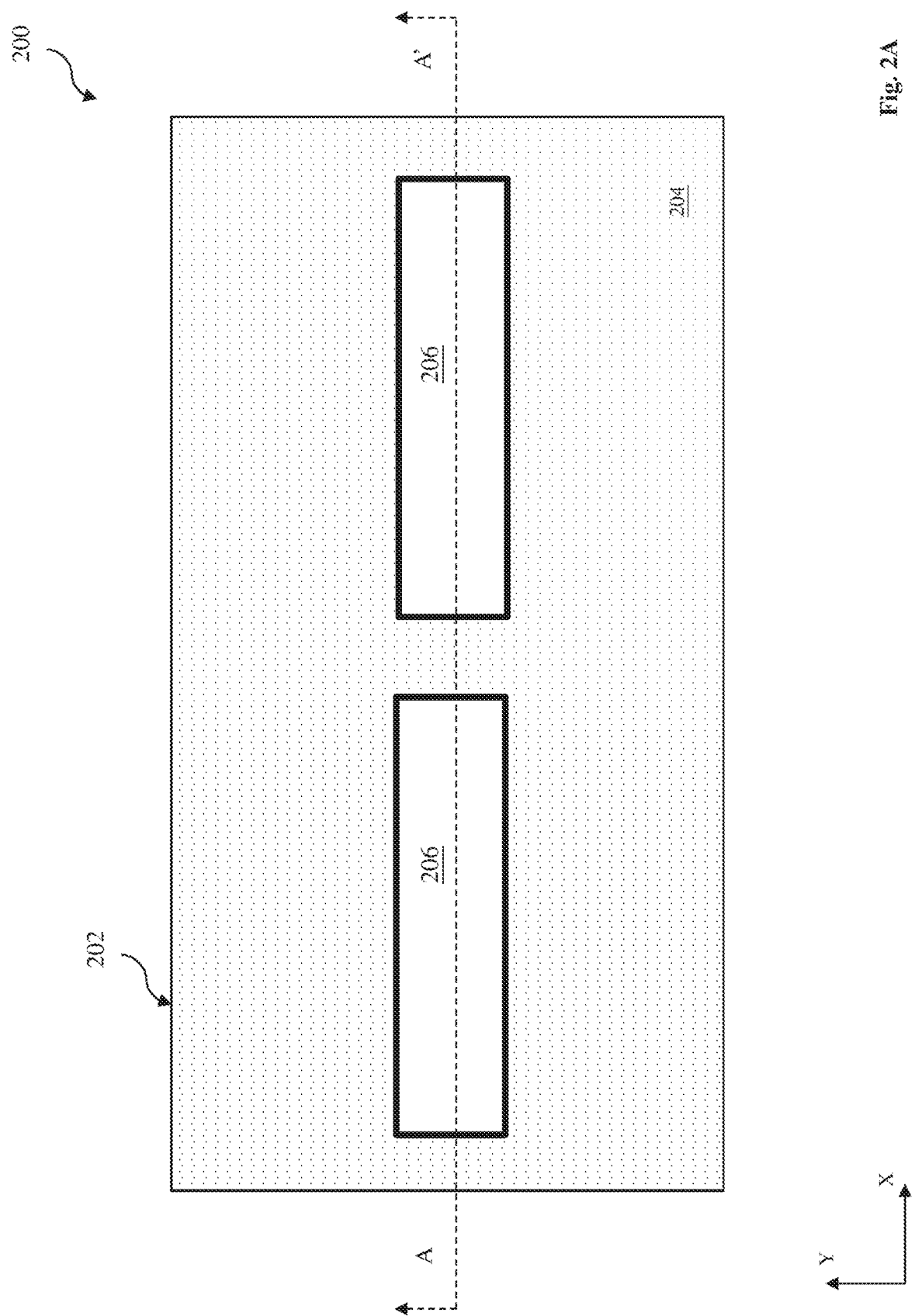
FIGS. 2A, 3A, 4A, 4A, 5A, 6A, 7A, 8A, 9A, 10A, 11A, and 12A are top views of a semiconductor structure at various fabrication stages constructed according to some embodiments.
Figure 2B:
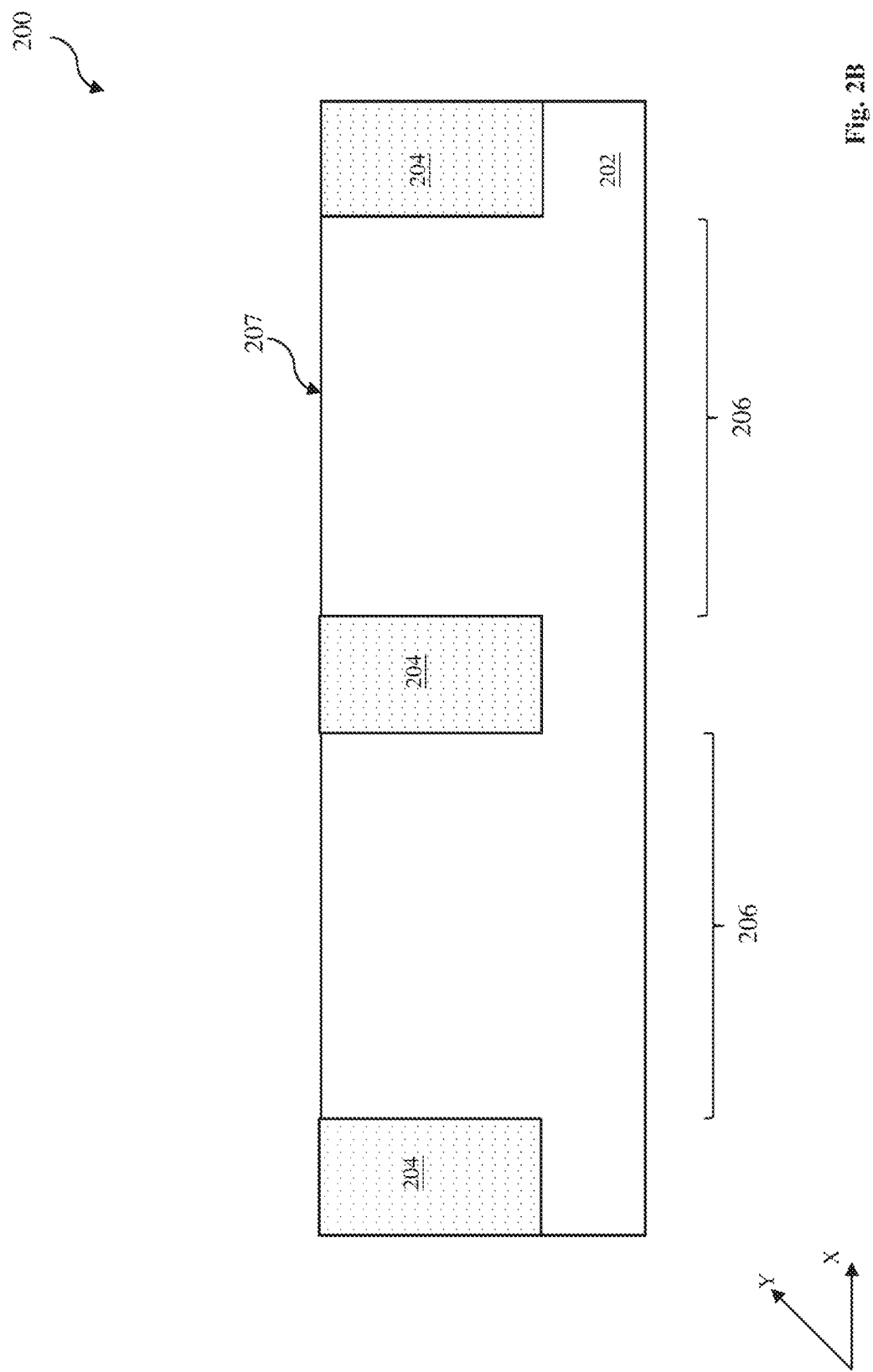
FIGS. 2B, 3B, 4B, 4B, 5B, 6B, 7B, 8B, 9B, 10B, 11B, and 12B are sectional views of the semiconductor structure at various fabrication stages constructed according to some embodiments.

Referring to FIGS. 2A and 2B, the method 100 begins with block 102 by providing a semiconductor substrate 202. FIG. 2A is a top view and FIG. 2B is a sectional view along the dashed line AA' of the semiconductor structure 200 in accordance with some embodiments. The semiconductor substrate 202 includes silicon. In some other embodiments, the substrate 202 includes germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Still referring to FIGS. 2A and 2B, the method 100 proceeds to an operation 104 by forming shallow trench isolation (STI) features 204 on the semiconductor substrate 202. In some embodiments, the STI features 204 are formed etching to form trenches, filling the trenches with dielectric material and polishing to remove the excessive dielectric material and planarize the top surface. One or more etching processes are performed on the semiconductor substrate 202 through openings of soft mask or hard mask, which are formed by lithography patterning and etching. The formation of the STI features 204 are further described below in accordance with some embodiments.

In the present example, a hard mask is deposited on the substrate 202 and is patterned by lithography process. The hard mask layers include a dielectric such as semiconductor oxide, semiconductor nitride, semiconductor oxynitride, and/or semiconductor carbide, and in an embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the semiconductor structure 200 by the lithography process. After patterning the resist, an etching process is performed on the semiconductor structure 200 to open the hard mask layer, thereby transferring the pattern from the resist layer to the hard mask layer. The remaining resist layer may be removed after the patterning the hard mask layer. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then etching process may be followed to etch the portions of the substrate 102 not covered by the patterned hard mask layer. The patterned hard mask layer is used as an etch mask during the etching processes to pattern the substrate 202. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 202 is partially etched. This may be achieved by controlling etching time or by controlling other etching parameter(s). After the etching processes, the fin structure 206 with fin active regions is defined on and extended from the substrate 102.

One or more dielectric material is filled in the trenches to form the STI feature 204. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor layer 202. In this case, the CMP process completely removes the hard mask. The hard mask may be removed alternatively by an etching process. Although in further embodiments, some portion of the hard mask layers remain after the CMP process.

Figure 3A:
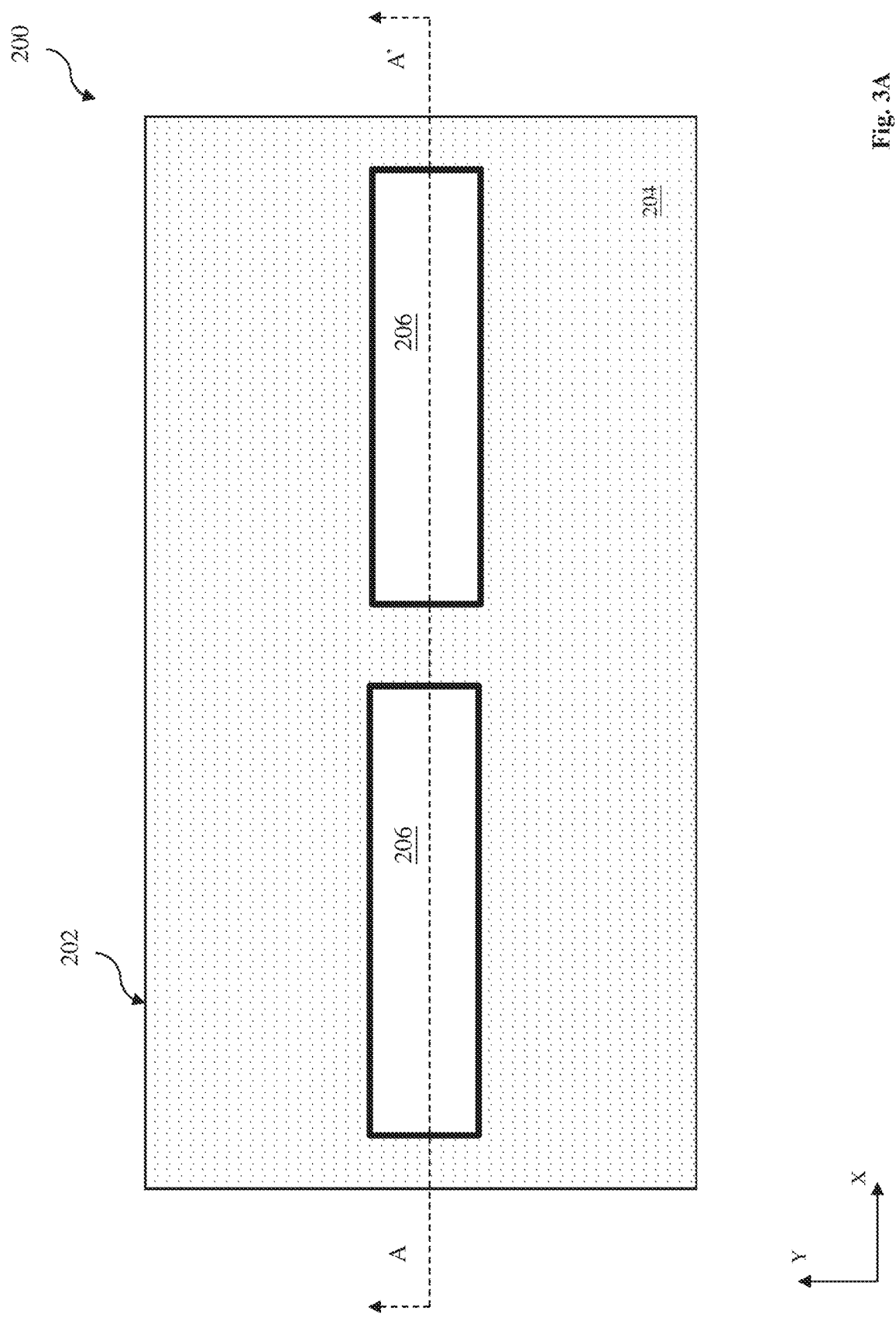
Figure 3B:
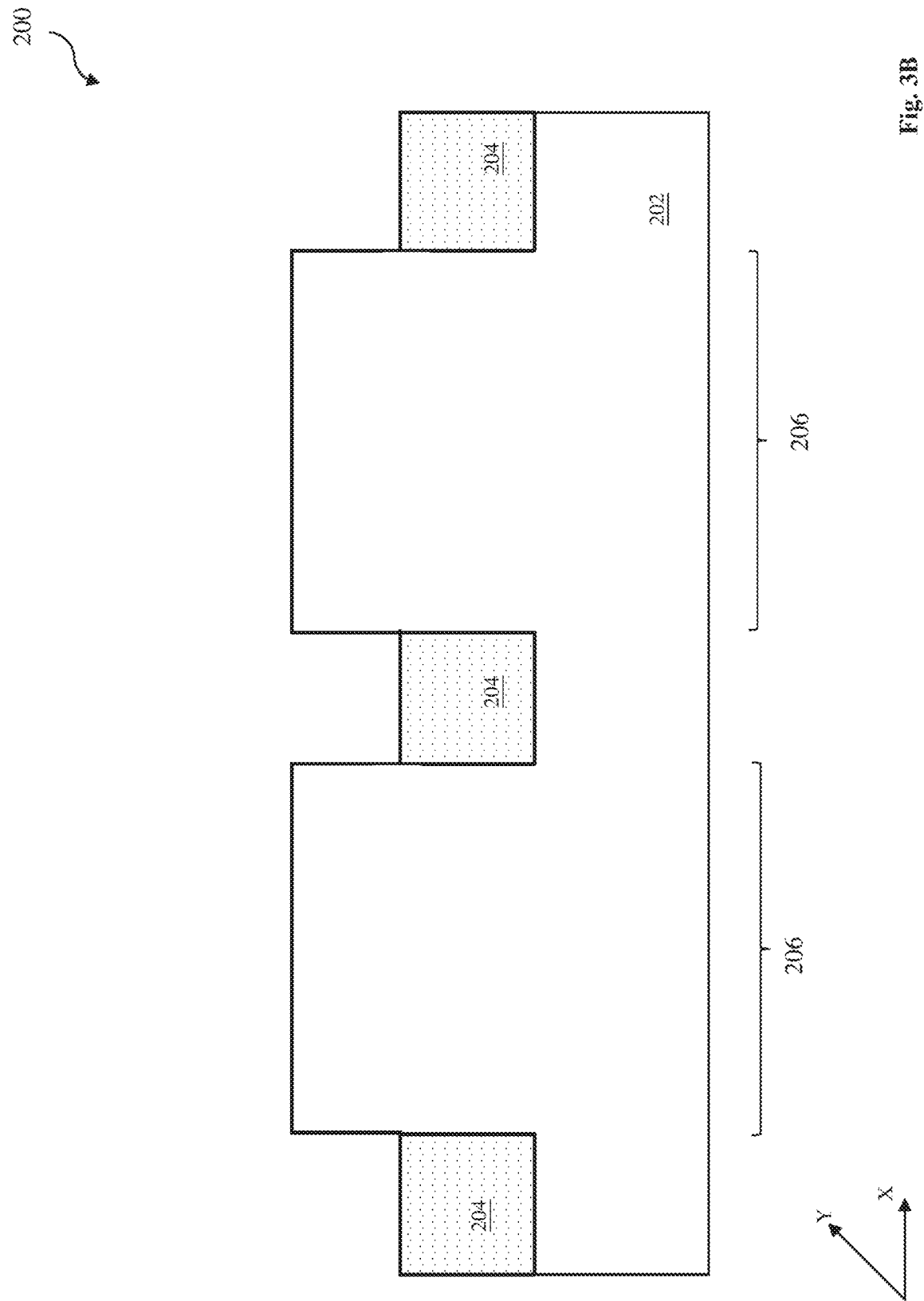

Referring to FIGS. 3A and 3B, the method 100 proceeds to an operation 106 by forming the fin structure 206 having multiple fin active regions (or fin features). FIG. 3A is a top view and FIG. 3B is a sectional view along the dashed line AA' of the semiconductor structure 200 in accordance with some embodiments. The operation 106 includes recessing the STI features 204 such that the fin active regions 206 are extruded above from the STI features 204. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. The fin active regions 206 are spaced from each other in a first direction (X direction). The fin active regions 206 have elongated shape and oriented along the X direction. A second direction (Y direction) is orthogonal to the X direction. The X and Y axes define the top surface 207 of the semiconductor substrate 202.

Various doping processes may be applied to the semiconductor regions to form various doped wells, such as n-wells and p-wells at the present stage or before the operation 106. Various doped wells may be formed in the semiconductor substrate by respective ion implantations.

Figure 4A:
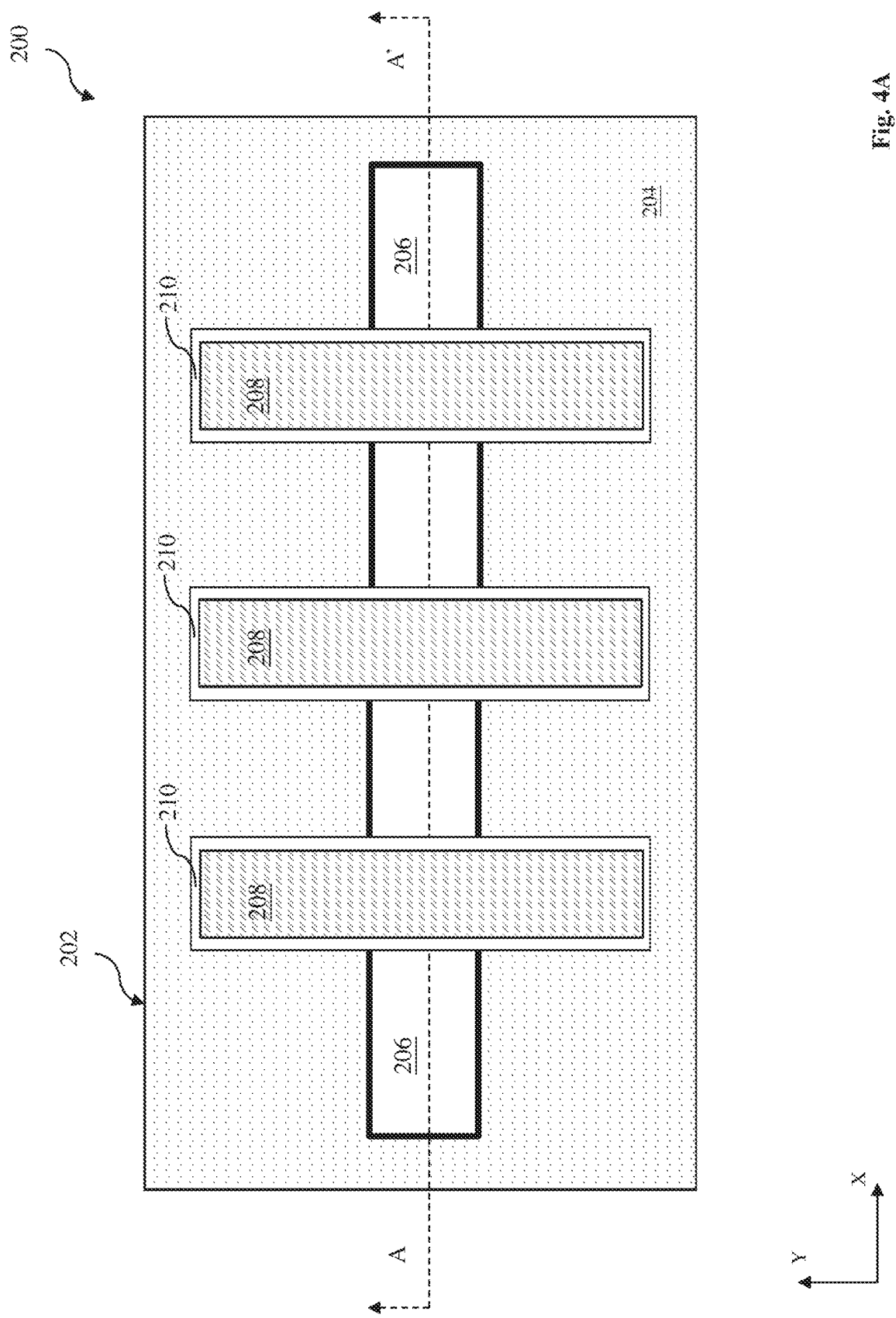
Figure 4B:
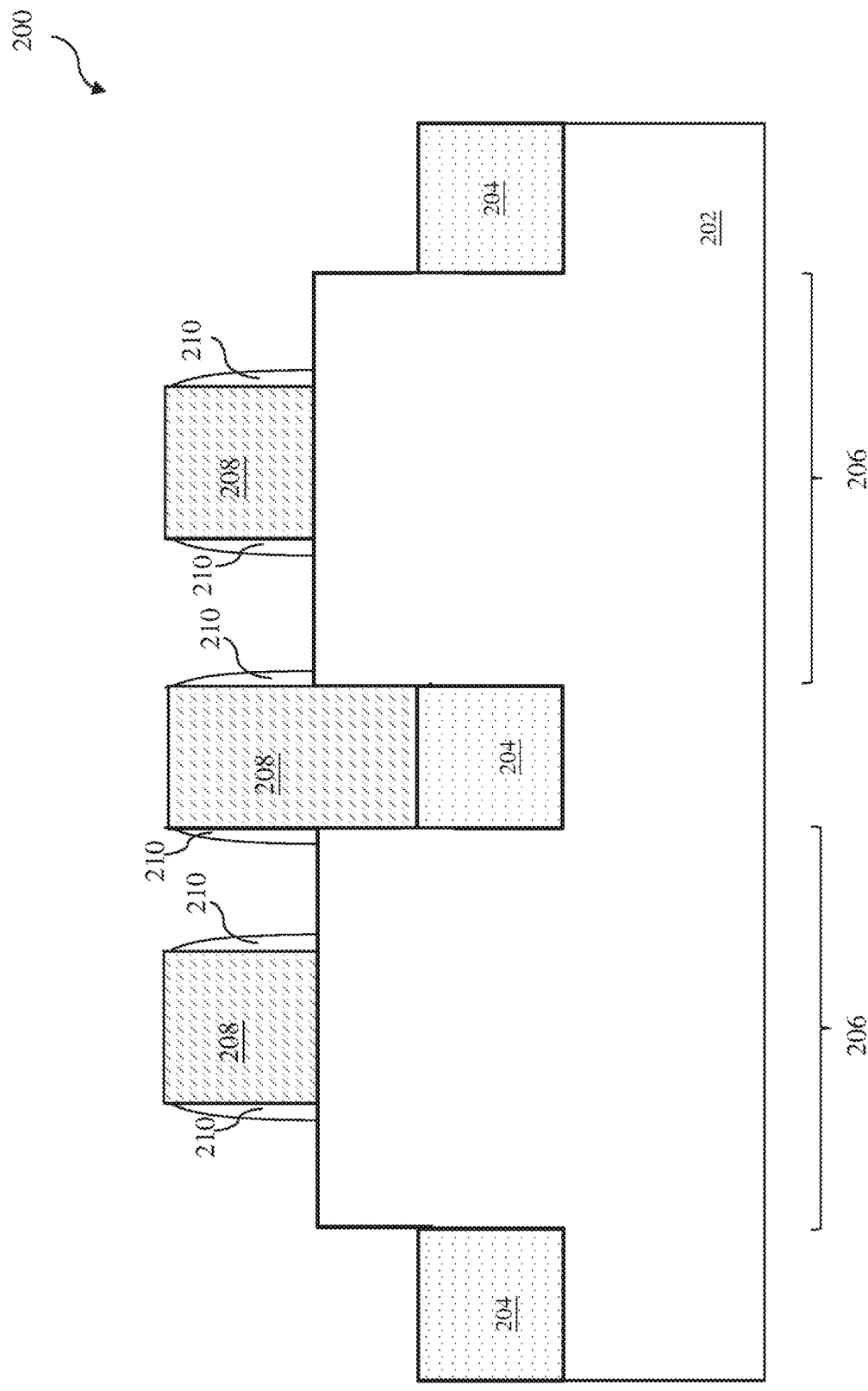

Referring to FIGS. 4A and 4B, the method 100 proceeds to an operation 108 by forming various dummy gate stacks 208 on the substrate 202. FIG. 4A is a top view and FIG. 4B is a sectional view along the dashed line AA' of the semi-conductor structure 200 in accordance with some embodiments. In the present embodiment, the dummy gate stacks 208 include three gate stacks disposed in parallel as illustrated in FIGS. 4A and 4B. The dummy gate stacks 208 have elongated shapes and are oriented in the second direction (Y direction). Each of the gate stacks 208 may be disposed over multiple fin active regions 206. Especially, some dummy gate stacks 208 are formed on the fin active regions 206 and some dummy gates 208 are formed on the STI feature 204. In some embodiments, one or more dummy gate stack is disposed on ends of the fin active regions 206 so that this gate stack is partially landing on the fin active region 206 and partially landing on the STI feature 204. Those edges are configured as dummy structures to reduce edge effect and improve overall device performance.

The dummy gate stacks 208 each may include a gate dielectric layer and a gate electrode. The gate dielectric layer includes a dielectric material, such as silicon oxide and the gate electrode includes a conductive material, such as polysilicon. The formation of the gate stacks 208 includes depositing the gate materials (including polysilicon in the present example); and patterning the gate materials by a lithographic process and etching. A gate hard mask may be formed on the gate materials and is used as an etch mask during the formation of the gate stacks. The gate hard mask may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the dummy gate stacks 208 includes forming a patterned resist layer on the hard mask by lithography process; etching the hard mask using the patterned resist layer as an etch mask; and etching the gate materials to form the gate stacks 208 using the patterned hard mask as an etch mask.

One or more gate sidewall features (or gate spacers) 210 are formed on the sidewalls of the gate stacks 208. The gate spacers 210 may be used to offset the subsequently formed source/drain features and may be used for designing or modifying the source/drain structure profile. The gate spacers 210 may include any suitable dielectric material, such as a semiconductor oxide, a semiconductor nitride, a semiconductor carbide, a semiconductor oxynitride, other suitable dielectric materials, and/or combinations thereof. The gate spacers 210 may have multiple films, such as two films (a silicon oxide film and a silicon nitride film) or three films ((a silicon oxide film; a silicon nitride film; and a silicon oxide film). The formation of the gate spacers 210 includes deposition and anisotropic etching, such as dry etching.

The gate stacks 208 are configured in the fin active regions for various field effect transistors (FETs), therefore also referred to as FinFETs. In some examples, the field effect transistors include n-type transistors and p-type transistors. In other examples, those field effect transistors are configured to form a logic circuit, a memory circuit (such as one or more static random access memory (SRAM) cells) or other suitable circuit. Furthermore, the gate stacks are configured to increase the pattern density uniformity and enhance the fabrication quality.

Figure 5A:
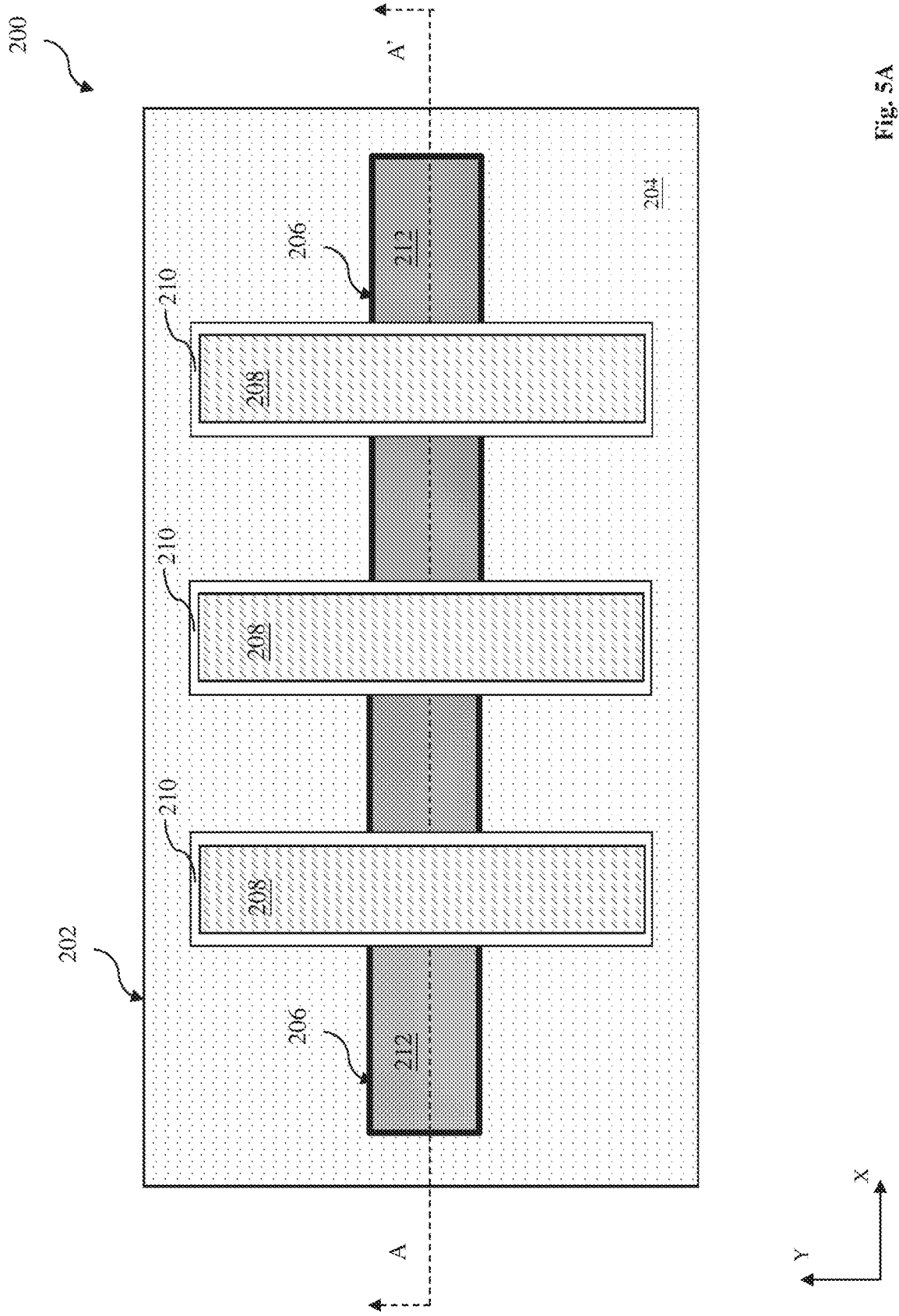
Figure 5B:
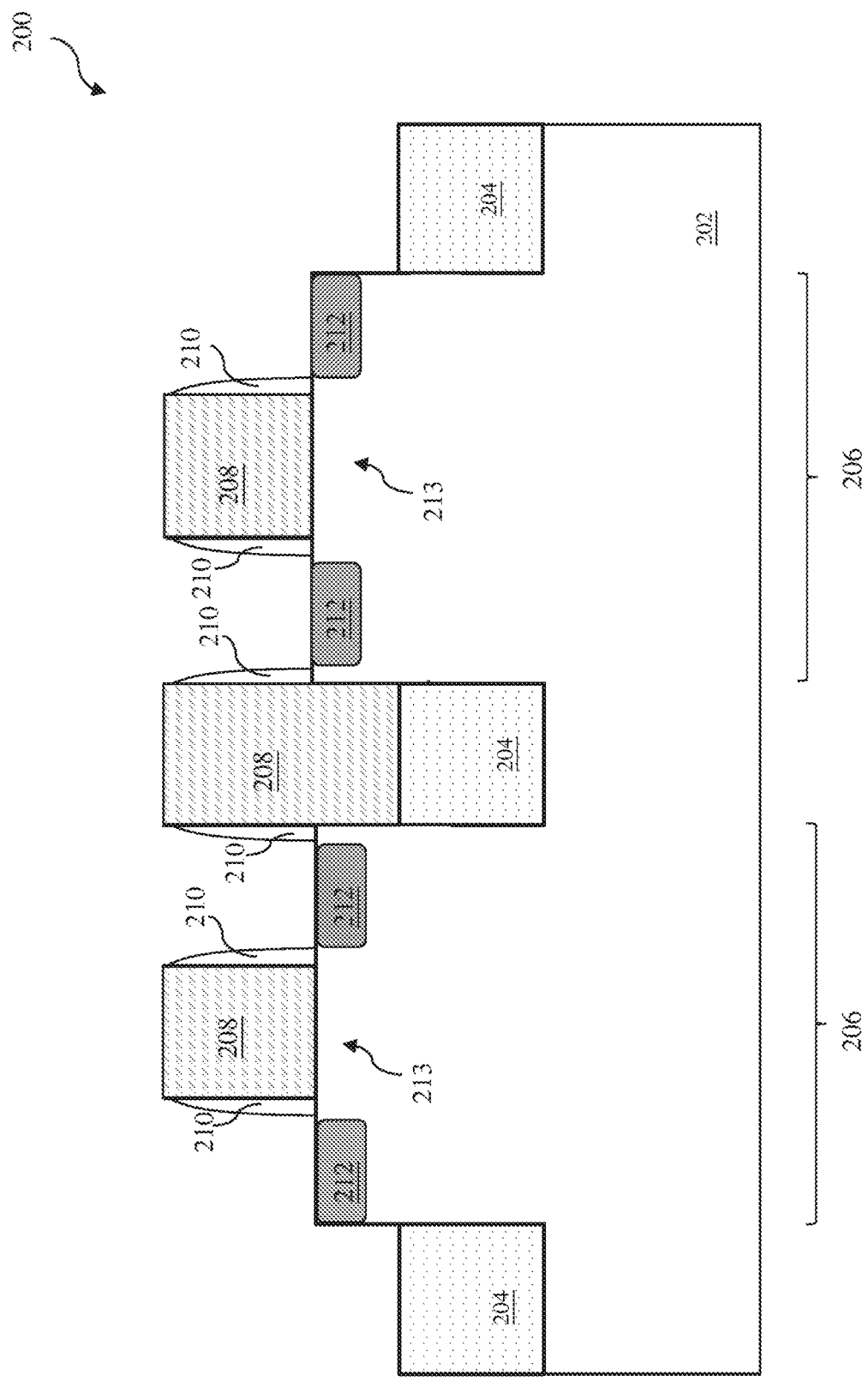

Referring to FIGS. 5A and 5B, the method 100 proceeds to an operation 110 by forming various source and drain features 212 to respective FinFETs. FIGS. 5A and 5B are a top view and a sectional view along the dashed line AA' of the semiconductor structure 200 in accordance with some embodiments. The source and drain features 212 may include both light doped drain (LDD) features and heavily doped source and drain (S/D). For example, each field effect transistor includes source and drain features formed on the respective fin active region and interposed by the gate stack 208. A channel is formed in the fin active region in a portion that is underlying the gate stack and spans between the source and drain features.

The raised source/drain features may be formed by selective epitaxy growth for strain effect with enhanced carrier mobility and device performance. The gate stacks 208 and gate spacer 210 constrain the source/drain features 212 to the source/drain regions. In some embodiments, the source/drain features 212 are formed by one or more epitaxy or epitaxial (epi) processes, whereby Si features, SiGe features, SiC features, and/or other suitable features are grown in a crystalline state on the fin active regions 206. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin structure 206.

The source/drain features 212 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 212 are not in-situ doped, an implantation process (i.e., a junction implant process) is performed to introduce the corresponding dopant into the source/drain features 212. In an embodiment, the source/drain features 212 in an nFET include SiC or Si doped with phosphorous, while those in a pFET include Ge or SiGe doped with boron. In some other embodiments, the raised source/drain features 212 include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the source/drain features 110. Suitable annealing processes include rapid thermal annealing (RTA), laser annealing processes, other suitable annealing technique or a combination thereof.

The source/drain features 212 are disposed on both sides of the gate stack 208. A channel (or channel region) 213 is defined on the fin active regions 206. The channel 213 is underlying the corresponding gate stack 208 and is interposed between the source/drain features 212 with proper doping concentrations and doping profiles. For examples, the channel 213 is p-type doped (or n-type doped) while the corresponding source/drain features 212 are n-type doped (or p-type doped). The channel 213 is formed through one or more steps to introduce suitable dopants, such as by ion implantation.

Figure 6A:
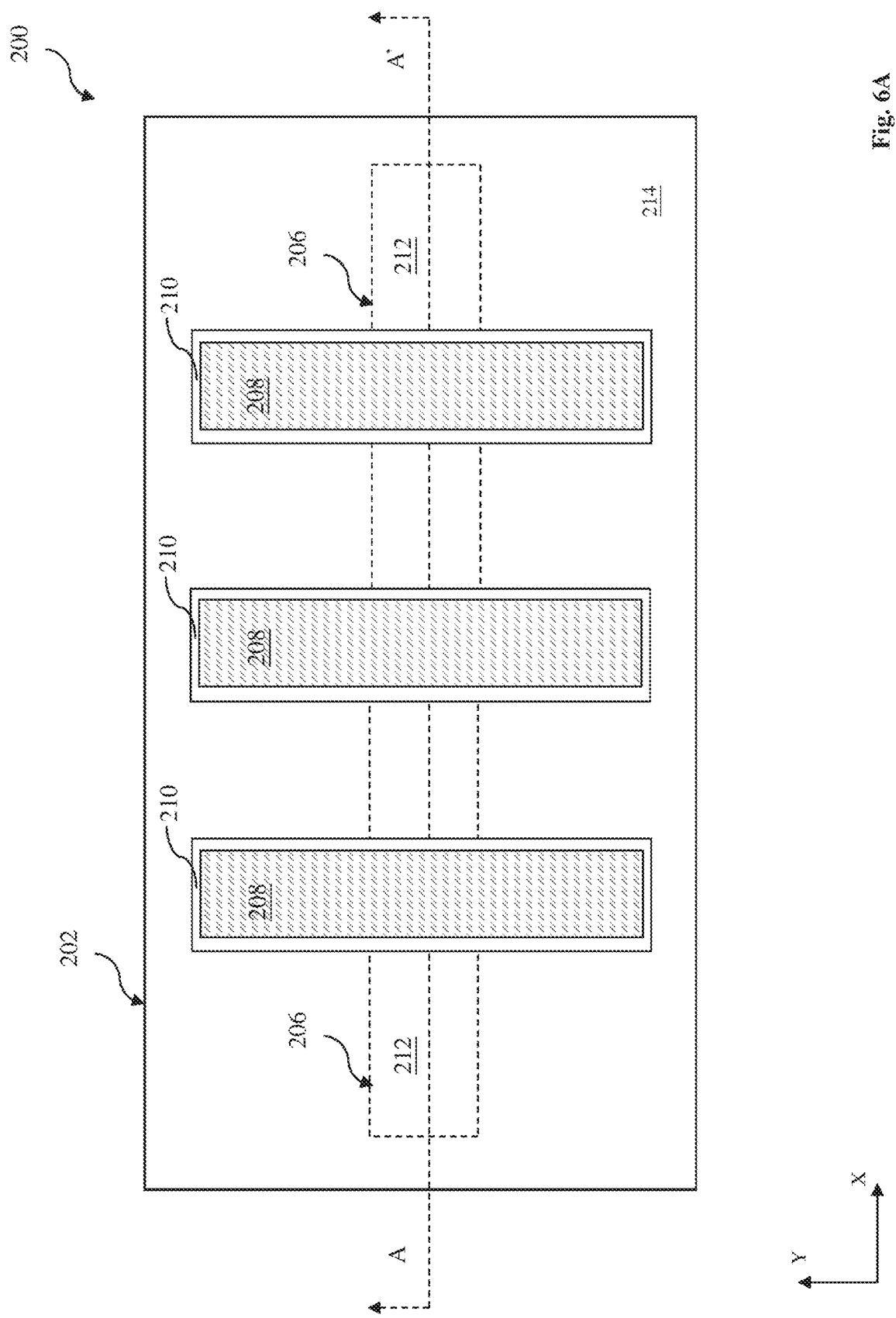
Figure 6B:
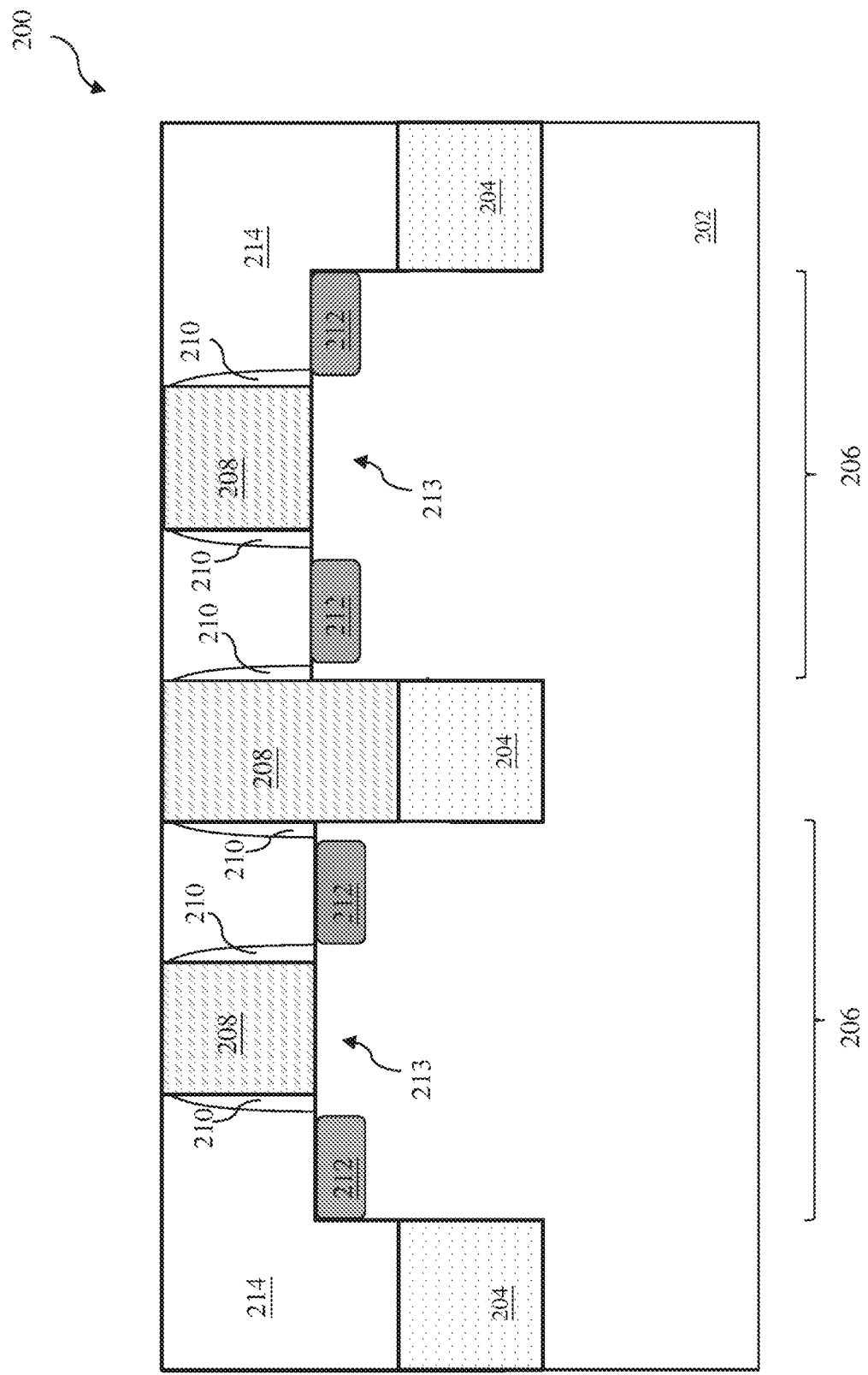

Referring to FIGS. 6A and 6B, the method proceeds to an operation 112, in which a first inter-level dielectric material (ILD) layer 214 is formed on the substrate, covering the source/drain features 212. FIGS. 6A and 6B are a top view and a sectional view along the dashed line AA' of the semiconductor structure 200 in accordance with some embodiments. The source/drain features 212 and the fin active regions 206 are illustrated in dashed lines in FIG. 6A and following figures in top view as those features are covered the overlying features, such as the ILD layer 214. The ILD layer 214 surrounds the dummy gate stacks 208 and the gate spacers 210 allowing the gate stacks 208 to be removed and a replacement gate to be formed in the resulting cavity (also referred to as gate trench). Accordingly, in such embodiments, the gate stacks 208 are removed after the formation of the ILD layer 214. The ILD layer 214 may also be part of an electrical interconnect structure that electrically interconnects various devices of the semiconductor structure 200. In such embodiments, the ILD layer 214 acts as an insulator that supports and isolates the conductive traces. The ILD layer 214 may include any suitable dielectric material, such as a semiconductor oxide, a semiconductor nitride, a semiconductor oxynitride, other suitable dielectric materials, or combinations thereof. In some embodiments, the formation of the ILD layer 214 includes deposition and CMP to provide a planarized top surface.

Figure 7A:
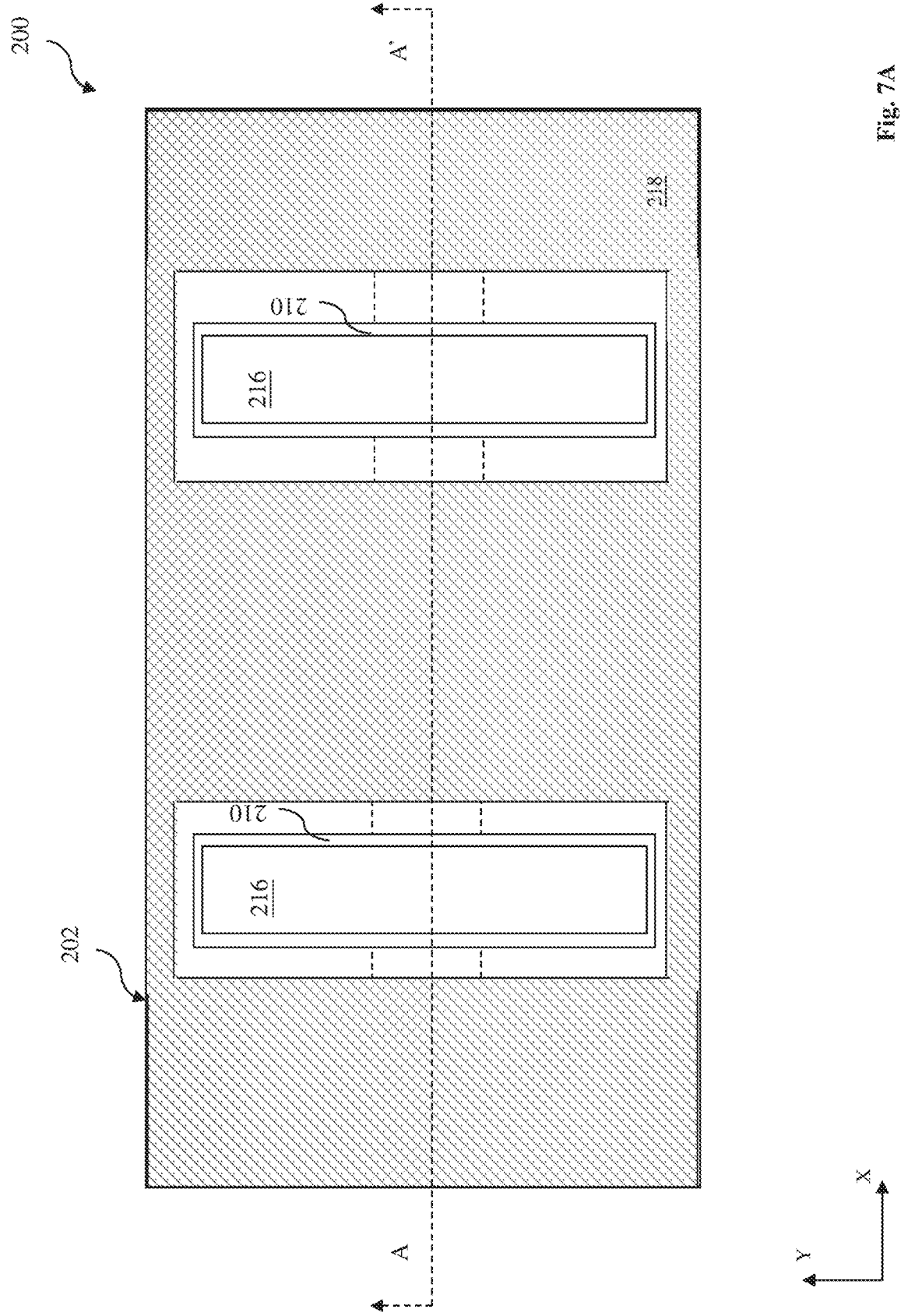
Figure 7B:
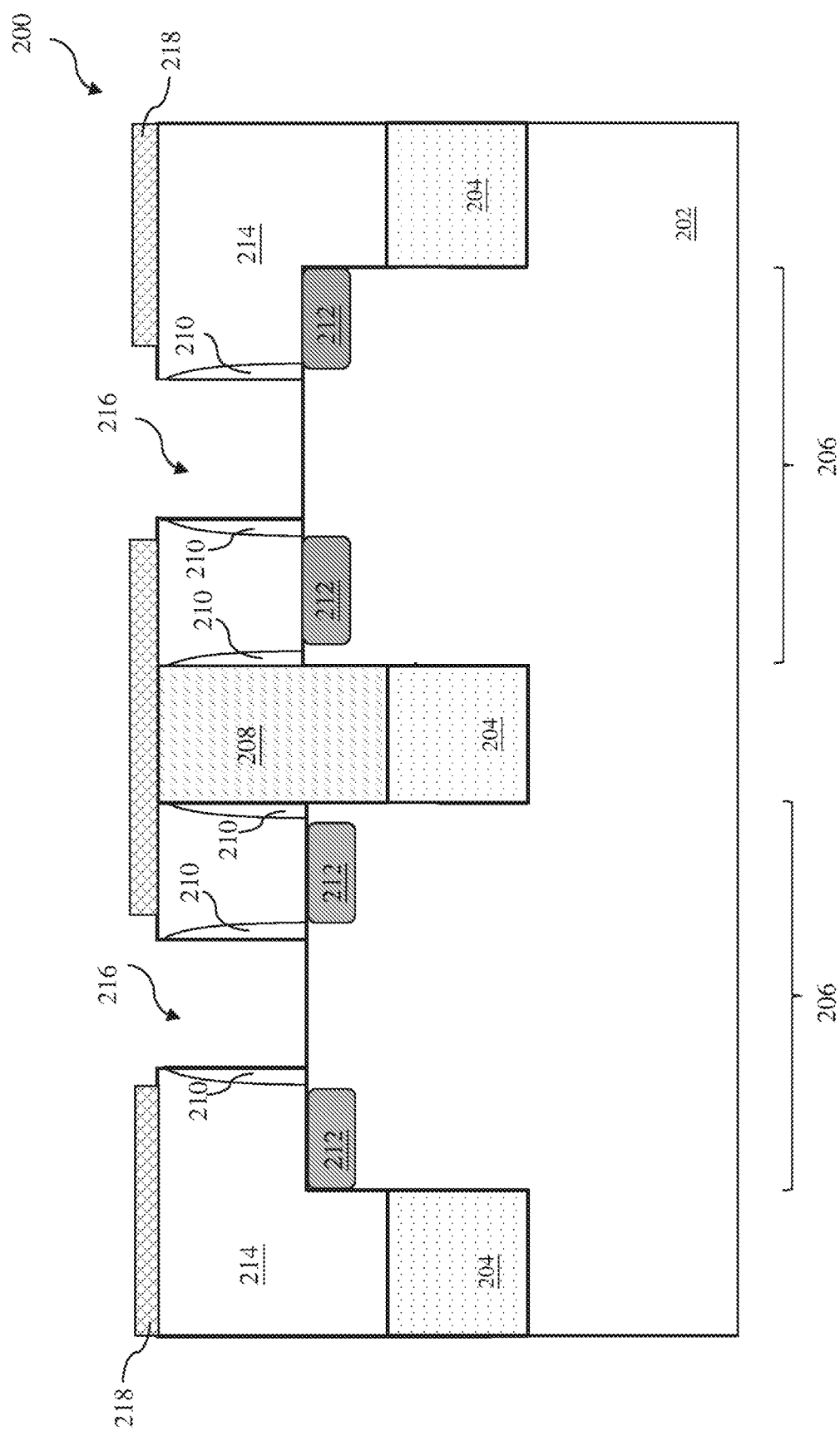
Figure 8A:
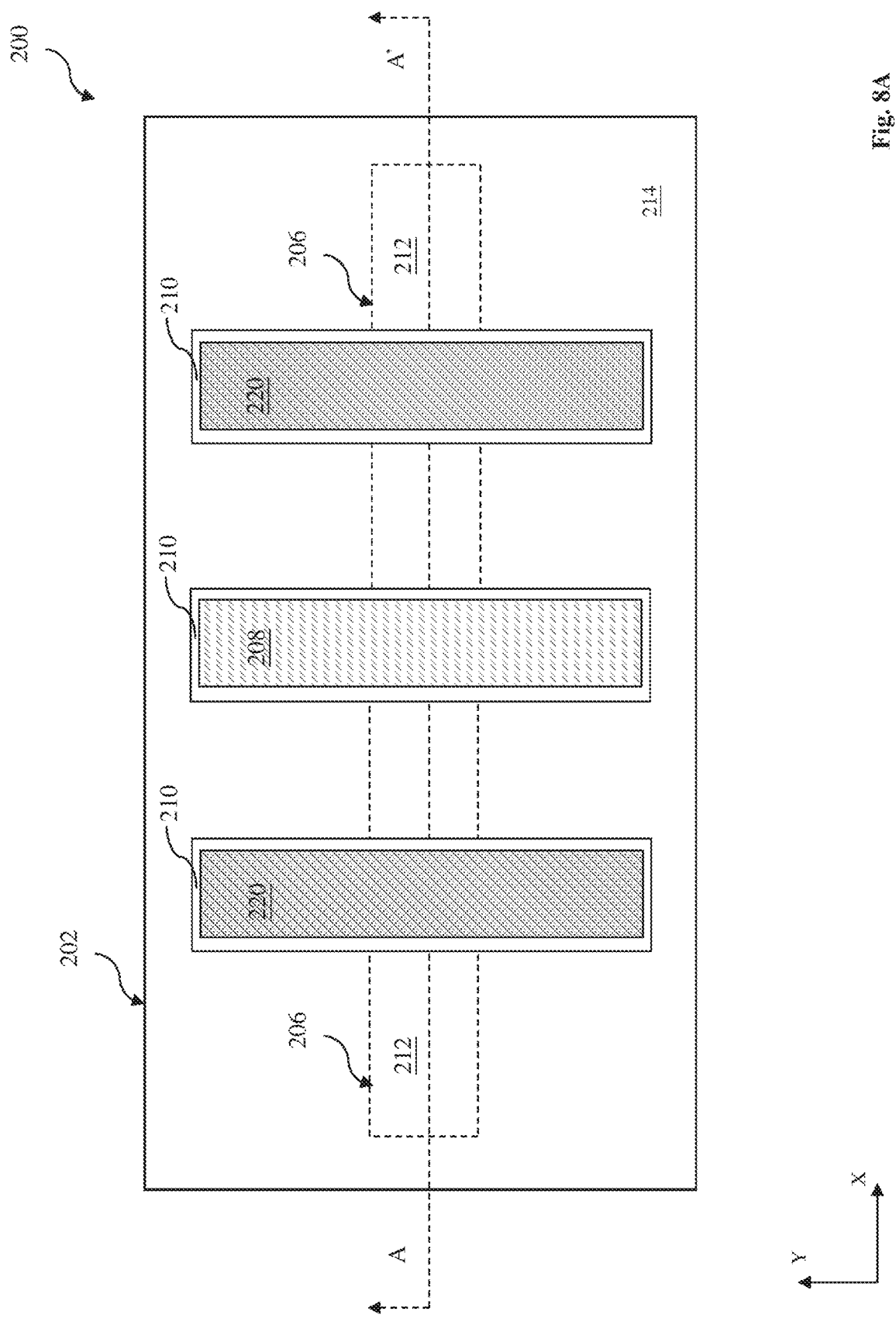
Figure 8B:
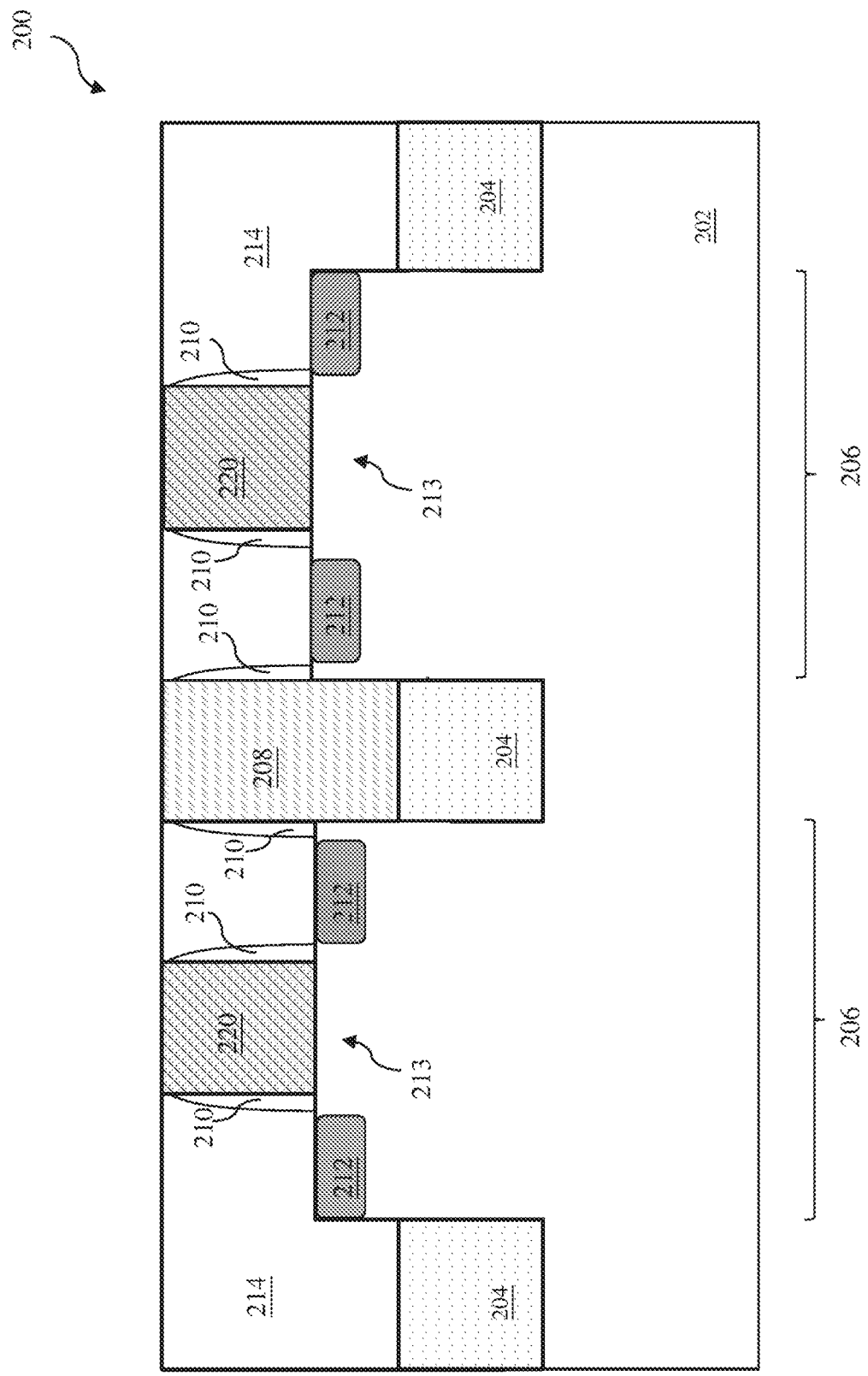

Referring to FIGS. 7A, 7B, 8A and 8B, the method proceeds to an operation 114 for gate replacement. Portions of the dummy gate stacks 208 are replaced by gate stacks with high k dielectric and metal, therefore also referred to as high-k metal gate stacks. FIGS. 7A and 7B are a top view and a sectional view along the dashed line AA' of the semiconductor structure 200 after the dummy gates 208 are removed and FIGS. 8A and 8B are a top view and a sectional view along the dashed line AA' of the semiconductor structure 200 after the high-k metal gate stacks are formed in accordance with some embodiments.

Only portions (or a subset) of the dummy gates 208 are replaced with high-k metal gate stacks and other portions (or another subset) are replaced with dielectric gates. In the present embodiment, the two dummy gates 208 formed on the fin active regions 206 are replaced by high-k metal gate stacks and the dummy gate stacks 208 formed on the STI features 204 are replaced by dielectric gates. The gate replacement process may include etching, deposition and polishing. In the present example for illustration, two dummy gate stacks 208 are selectively removed, resulting in gate trenches 216, as illustrated in FIGS. 7A and 7B. In some embodiments, a photoresist layer is formed on the ILD layer 214 and the dummy gate stacks 208 by a lithography process. The photoresist layer includes openings that expose the dummy gate stacks to be removed for replacement. Thereafter, the dummy gate stacks 208 are selectively removed by an etching process, such as a wet etch, using the photoresist layer as an etch mask. The etching process may include multiple etching steps to remove the dummy gate stacks if more materials present.

In alternative embodiments, a hard mask 218 is deposited on the ILD layer 214 and the dummy gate stacks 208, and is further patterned by a lithography process. The patterned hard mask 218 includes openings that expose the dummy gate stacks to be removed for replacement. Thereafter, the dummy gate stacks 208 are selectively removed by an etching process, such as a wet etch. The etching process may include multiple etching steps to remove the dummy gate stacks if more materials present. The formation of the hard mask 218 includes deposition, such as CVD. The hard mask 218 may include a suitable material different from the dielectric material of the ILD layer 214 to achieve etching selectivity during the etching process to form contact openings. In some embodiments, the hard mask 218 includes silicon nitride. For examples, the hard mask 218 of silicon nitride (SiN) is formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Figure 13:
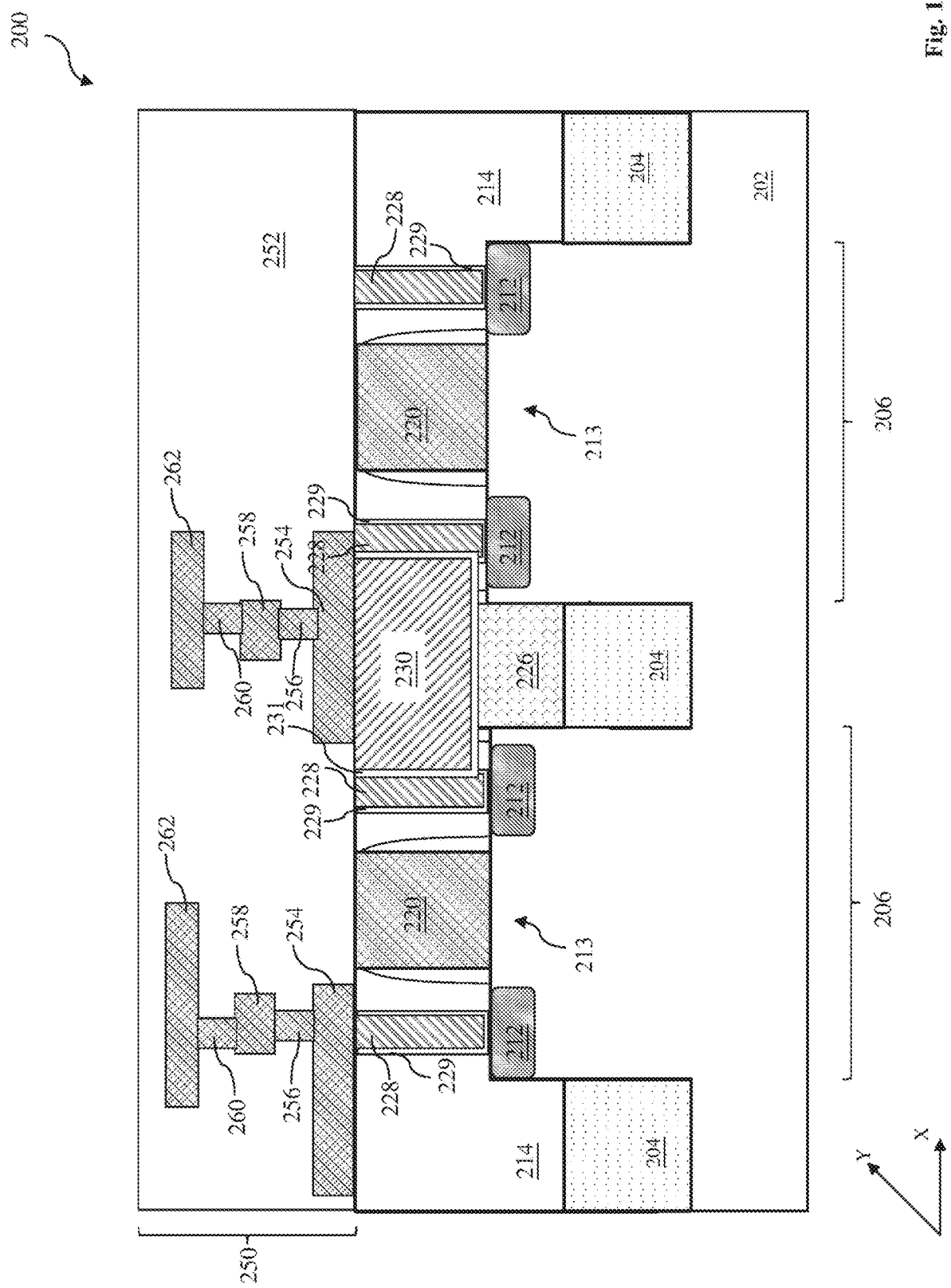
FIGS. 13 and 14 are sectional views of the semiconductor structure constructed according to various embodiments.
Figure 14:
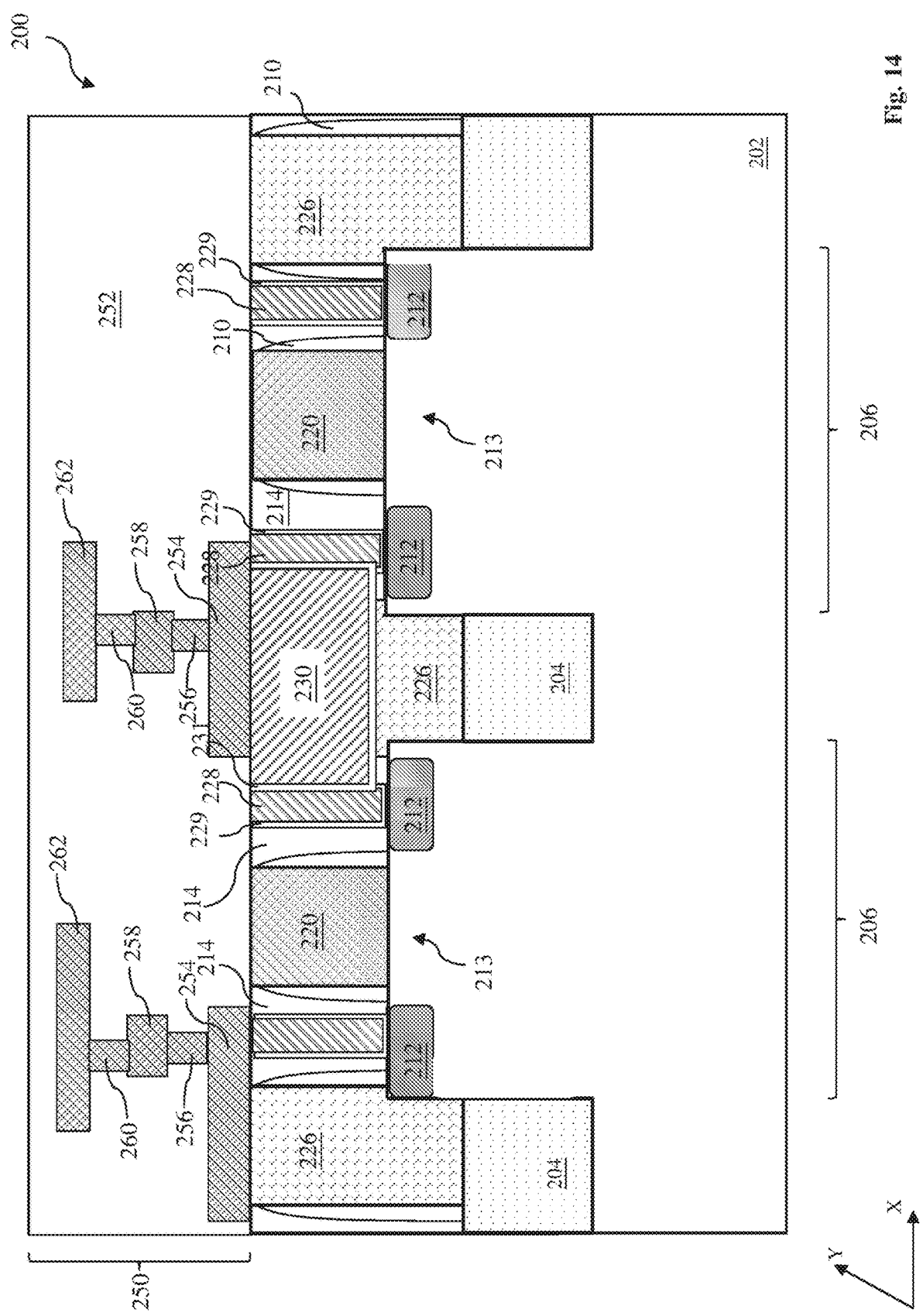

Then the gate materials, such as high k dielectric material and metal, are deposited in the gate trenches 216 to form the high-k metal gate stacks 220, as illustrated in FIGS. 8A and 8B. A CMP process is further implemented to polish and remove the excessive gate materials from the semiconductor structure 200. The hard mask 218 may be removed by the CMP process as well or by an additional etching process. The structure and the formation of the gate stacks 220 are further described below with a reference to FIGS. 13 and 14. FIGS. 13 and 14 illustrate sectional views of a gate stack 220 in accordance with various embodiments.

The gate stack 220 is formed in the gate trench by a proper procedure, such as a procedure that includes deposition and CMP. Although it is understood that the gate stack 220 may have any suitable gate structure and may be formed by any suitable procedure. The gate stack 220 is formed on the substrate 202 overlying the channel region of the fin active region 206. The gate stack 220 includes a gate dielectric layer 232 and a gate electrode 234 disposed on the gate dielectric layer 232. In the present embodiment, the gate dielectric layer 232 includes high-k dielectric material and the gate electrode 234 includes metal or metal alloy. In some examples, the gate dielectric layer and the gate electrode each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions.

Figure 15:
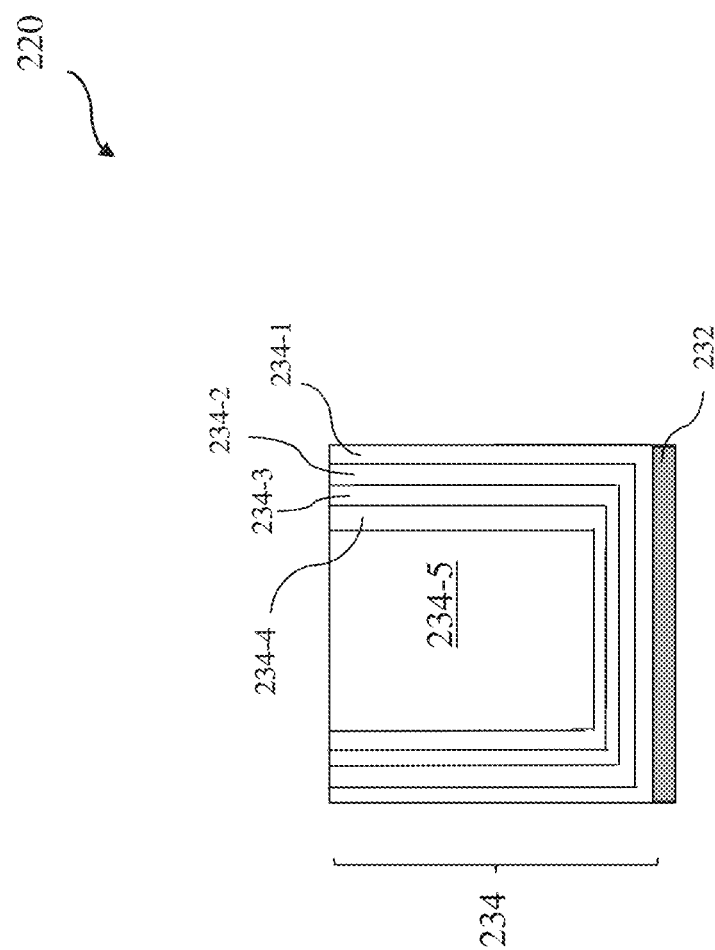
FIGS. 15 and 16 are sectional views of a gate stack of the semiconductor structure constructed according to various embodiments.
Figure 16:
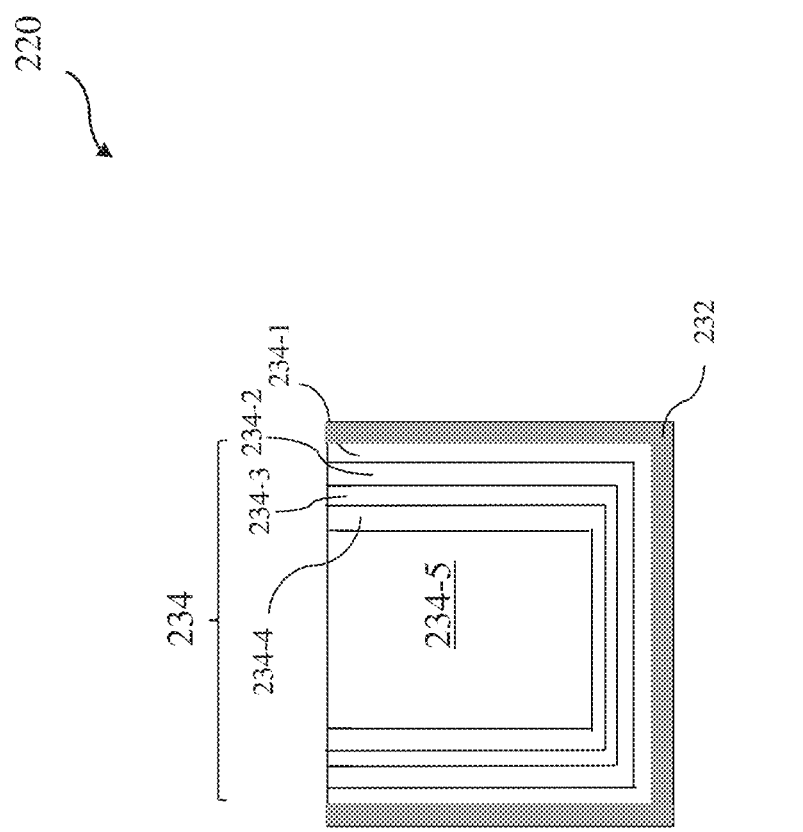

The gate dielectric layer 232 may further includes an interfacial layer sandwiched between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some embodiments, the gate dielectric layer 232 is formed on the fin active region 206 at the operation 108 that forms the gate stack 208. In this case, the gate dielectric feature 232 is shaped as illustrated in FIG. 15. In some other embodiments, the gate dielectric feature 232 is formed in the high-k last process, in which the gate dielectric feature 232 is deposited in the gate trench at the operation 114. In this case, the gate dielectric feature 232 is U-shaped, as illustrated in FIG. 16.

The gate electrode 234 may include multiple conductive materials. In some embodiments, the gate electrode 234 includes a capping layer 234-1, a blocking layer 234-2, a work function metal layer 234-3, another blocking layer 234-4 and a filling metal layer 234-5. In furtherance of the embodiments, the capping layer 234-1 includes titanium nitride, tantalum nitride, or other suitable material, formed by a proper deposition technique such as ALD. The blocking layer 234-2 includes titanium nitride, tantalum nitride, or other suitable material, formed by a proper deposition technique such as ALD. In some examples, the block layers may not present or only one of them presents in the gate electrode.

The work functional metal layer 234-3 includes a conductive layer of metal or metal alloy with proper work function such that the corresponding FET is enhanced for its device performance. The work function (WF) metal layer 1606 is different for a pFET and a nFET, respectively referred to as an n-type WF metal and a p-type WF metal. The choice of the WF metal depends on the FET to be formed on the active region. For example, the semiconductor structure 200 includes a first active region for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 234-4 includes titanium nitride, tantalum nitride, or other suitable material, formed by a proper deposition technique such as ALD. In various embodiments, the filling metal layer 234-5 includes aluminum, tungsten or other suitable metal. The filling metal layer 234-5 is deposited by a suitable technique, such as PVD or plating.

Referring back to FIGS. 8A and 8B, after the operation 114, the high-k metal gate stacks 220 are formed on the fin active regions 206. In some embodiments, the method 100 may also include an operation to form a protection layer on top of the gate stacks 220 to protect the gate stacks 220 from loss during subsequent processing. The formation of the hard mask includes recessing the gate stacks 220 by selective etching; deposition (such as CVD); and CMP according to the present example. The protection layer may include a suitable material different from the dielectric material of the ILD layers to achieve etching selectivity during the etching process to form contact openings. In some embodiments, the protection layer includes silicon nitride.

Figure 9A:
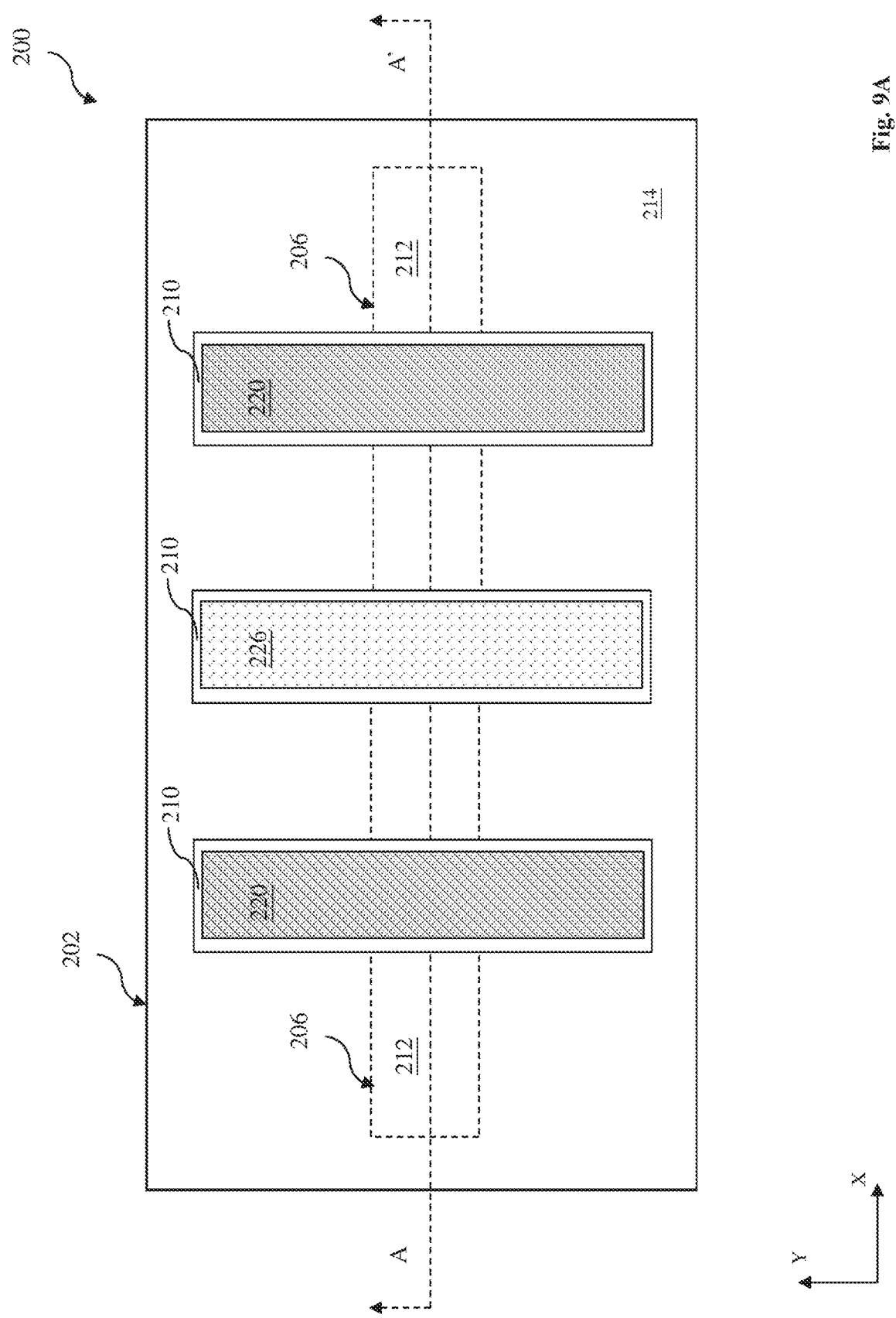
Figure 9B:
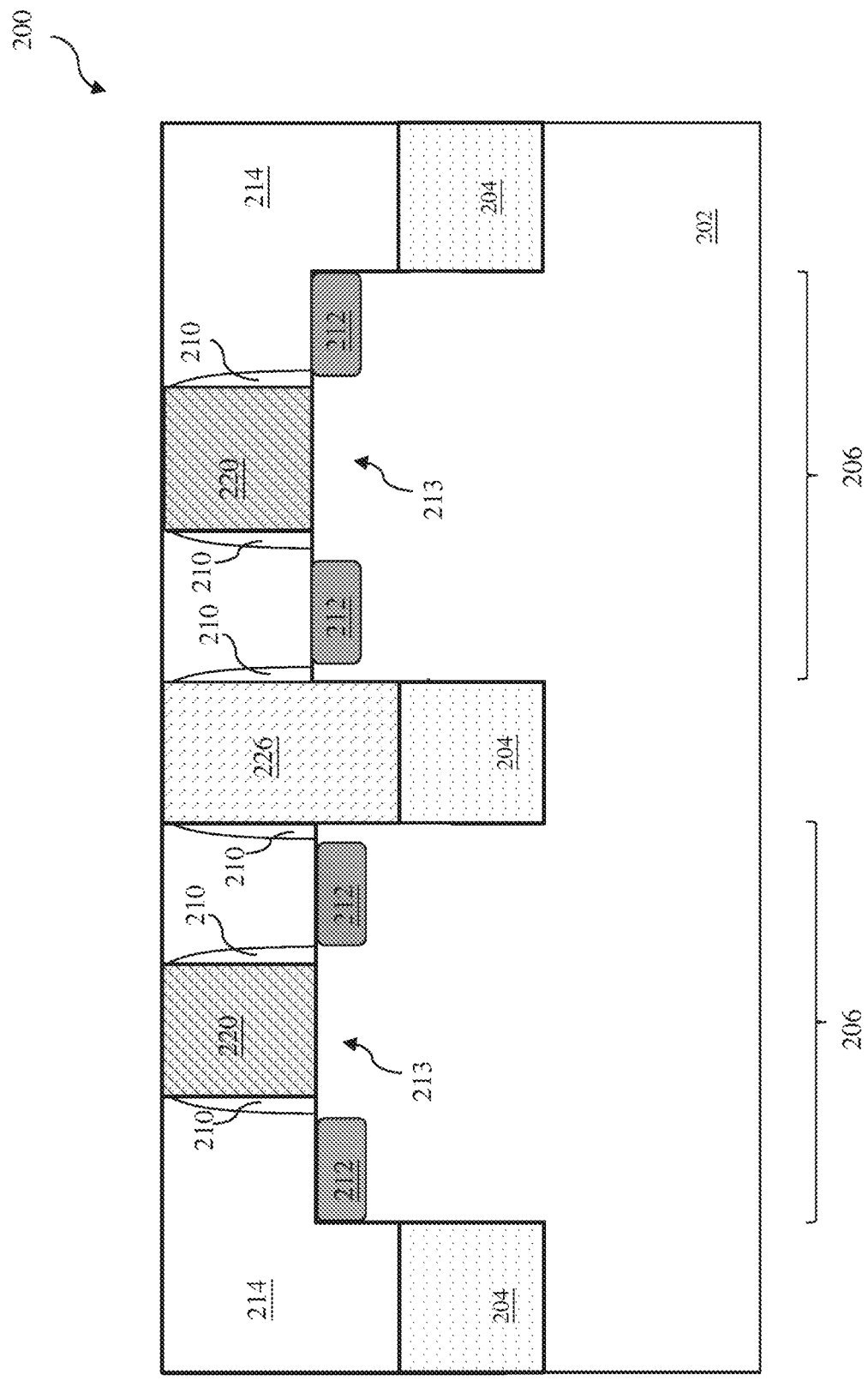

Referring to FIGS. 9A and 9B, the method 100 proceeds to an operation 116 by replacing portions of the dummy gates 208 with dielectric gates 226. FIGS. 9A and 9B are a top view and a sectional view of the semiconductor structure 200 in accordance with some embodiments. The formation of a dielectric gate 226 is a replacement procedure similar to the replacement procedure to form the high-k metal gate stacks 220 by the operation 114. For example, the operation 116 includes selectively etching to remove the dummy gates, resulting in the gate trenches; filling the gate trenches with one or more dielectric material by deposition; and CMP. However, the filling material is dielectric material. The deposition may include a suitable deposition technique, such as CVD or flowable CVD (FCVD).

The dielectric gate 226 is a dielectric feature that does not function as a gate but functions as an isolation feature. The dielectric gate 226 includes one or more suitable dielectric materials, such as silicon oxide, silicon nitride, other suitable dielectric material or a combination thereof. In the present embodiment, the dielectric gate 226 is directly landing on a STI feature 204, thereby forming a continuous isolation wall to separate and isolate the devices on both sides from each other. Especially, the active regions 206 are fin active regions with the top surface above the top surface of the STI features 204, the bottom surface of the dielectric gate 226 is below the bottom surface of the high-k metal gate stacks 220 and is partially embedded in the fin active regions. In some embodiments, the STI feature 204 and the dielectric gate 226 are different in composition. Furthermore, the dielectric gate 226 is also surrounded by the gate spacer 210 in a way similar to the high-k metal gate stacks 220. The gate spacer 210 and the dielectric gate 226 are different for etching selectivity. For example, the gate spacer 210 includes silicon nitride and the dielectric gate 226 includes silicon oxide.

Figure 10A:
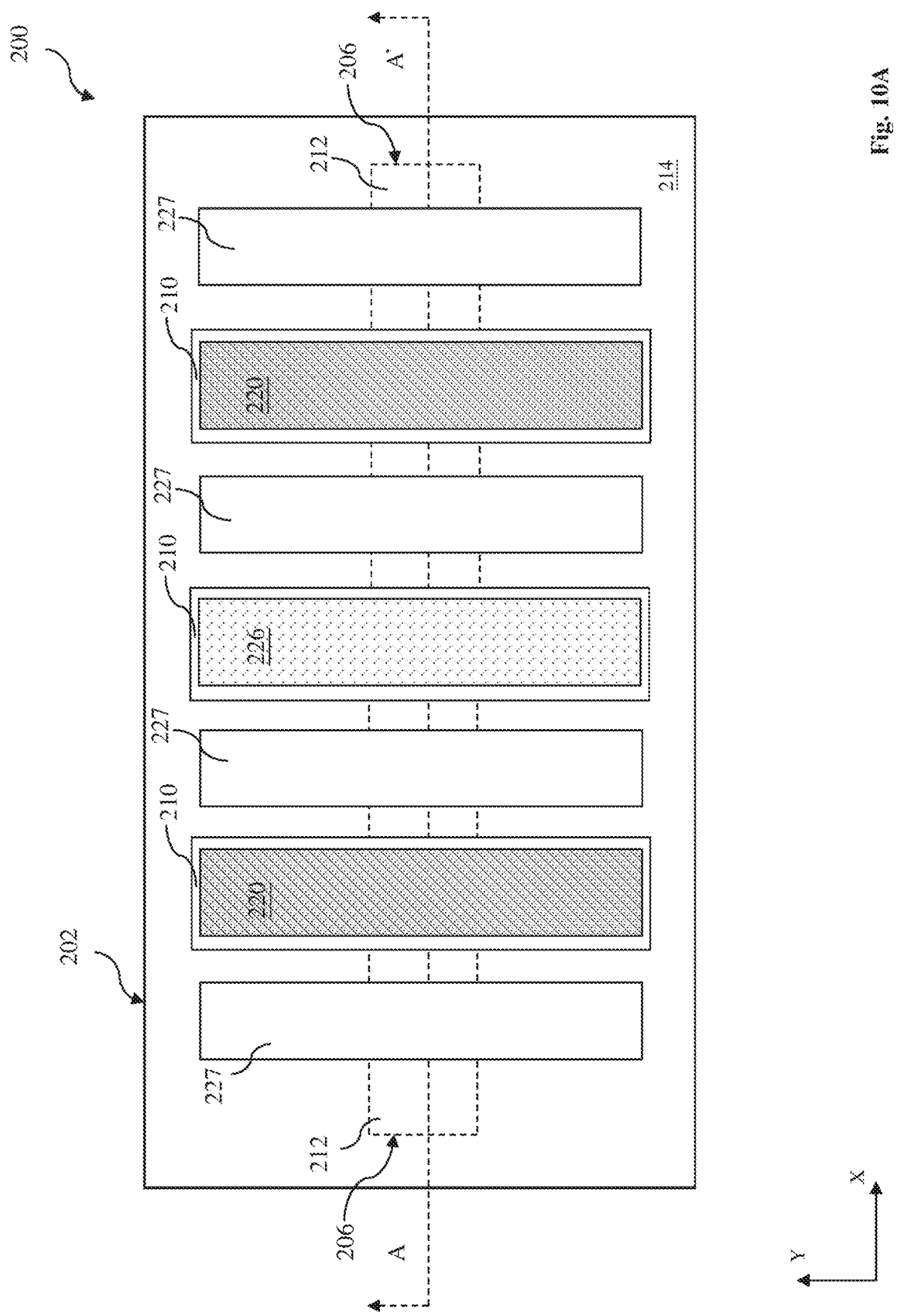
Figure 10B:
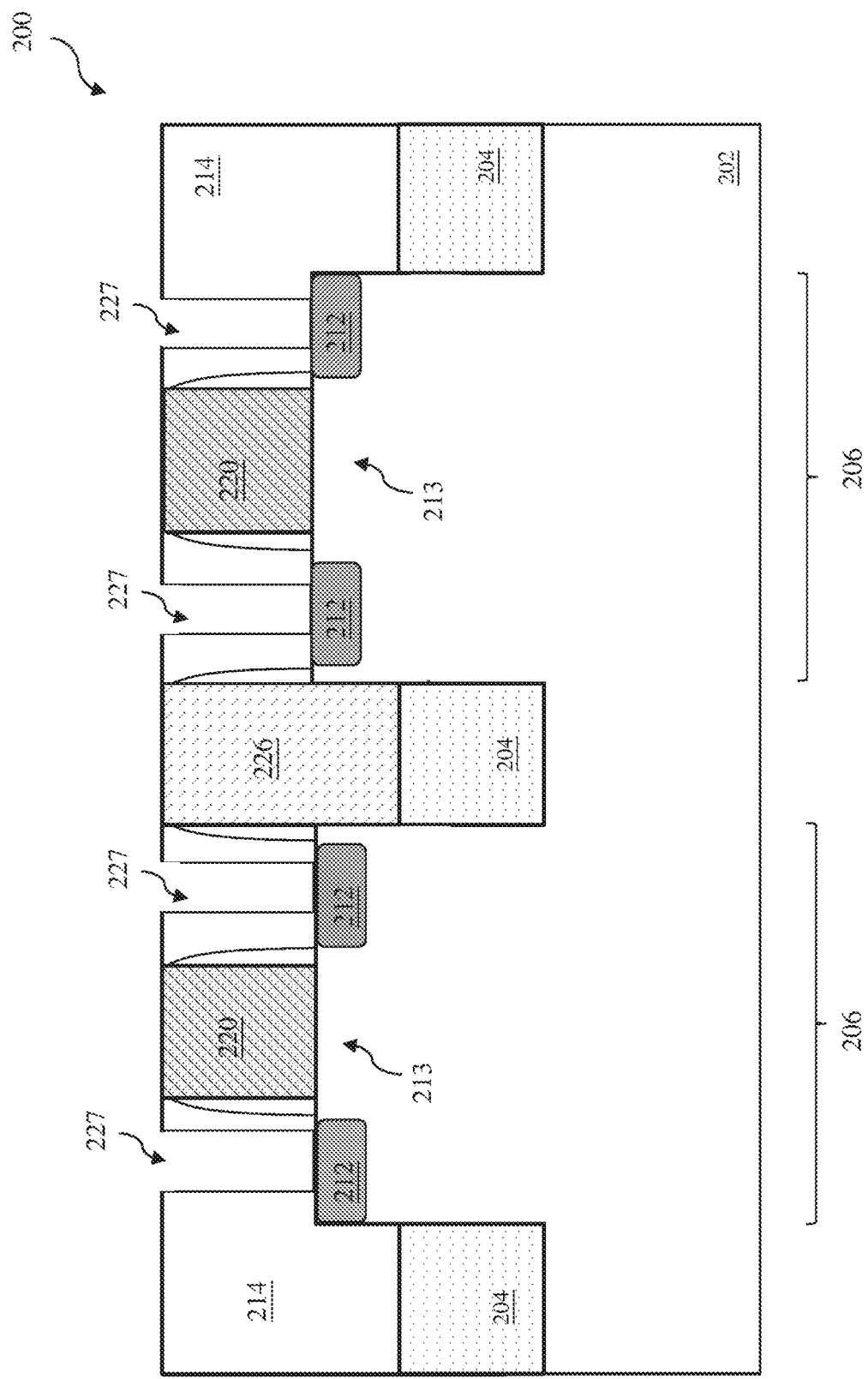

Referring to FIGS. 10A and 10B, the method 100 proceeds to an operation 118 by patterning the ILD layer 214 to form contact holes (or trenches) 227 that expose the source/drain features 212. The formation of the contact holes 227 includes lithography process; and etching, and may further use hard mask for patterning.

Figure 11A:
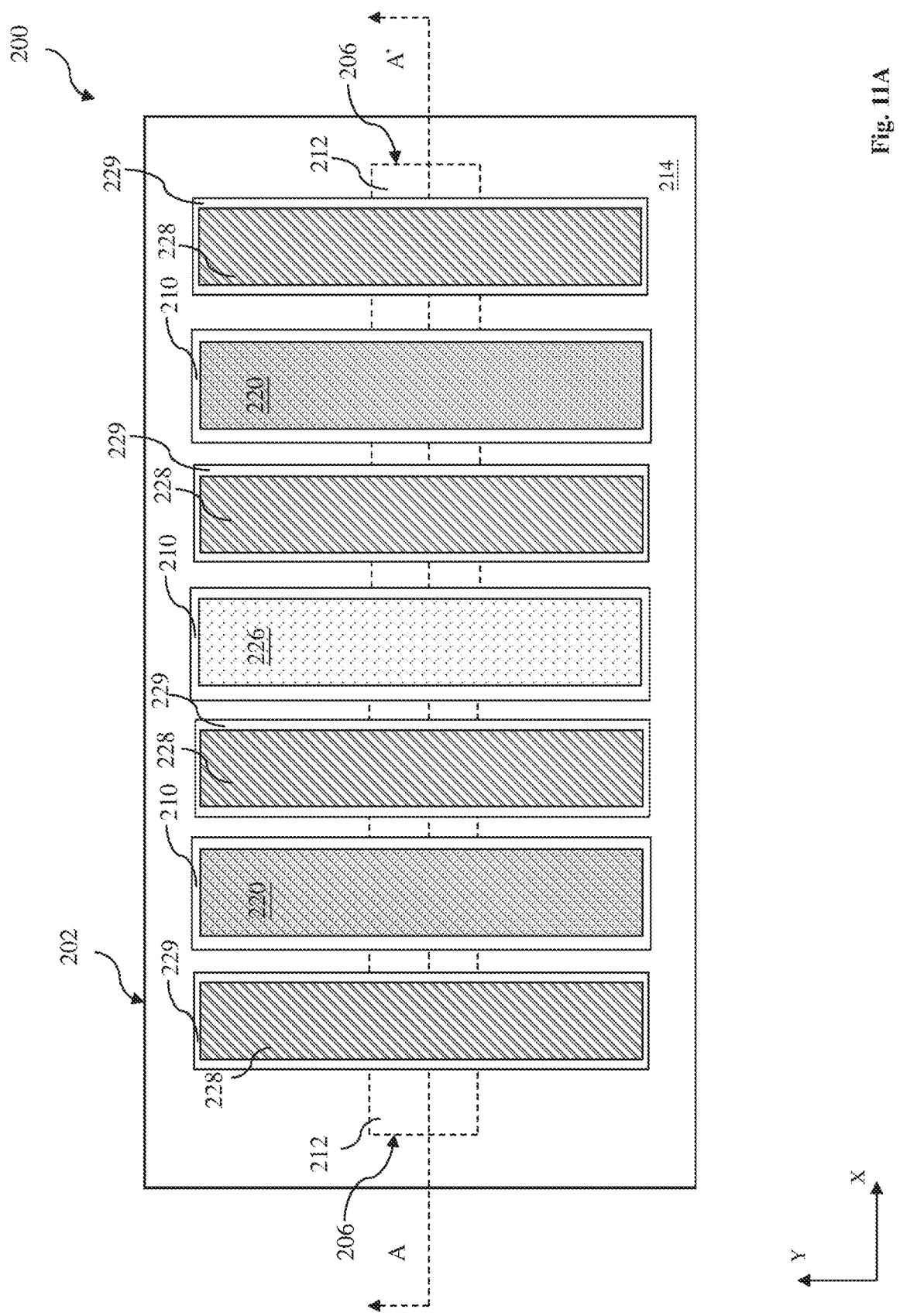
Figure 11B:
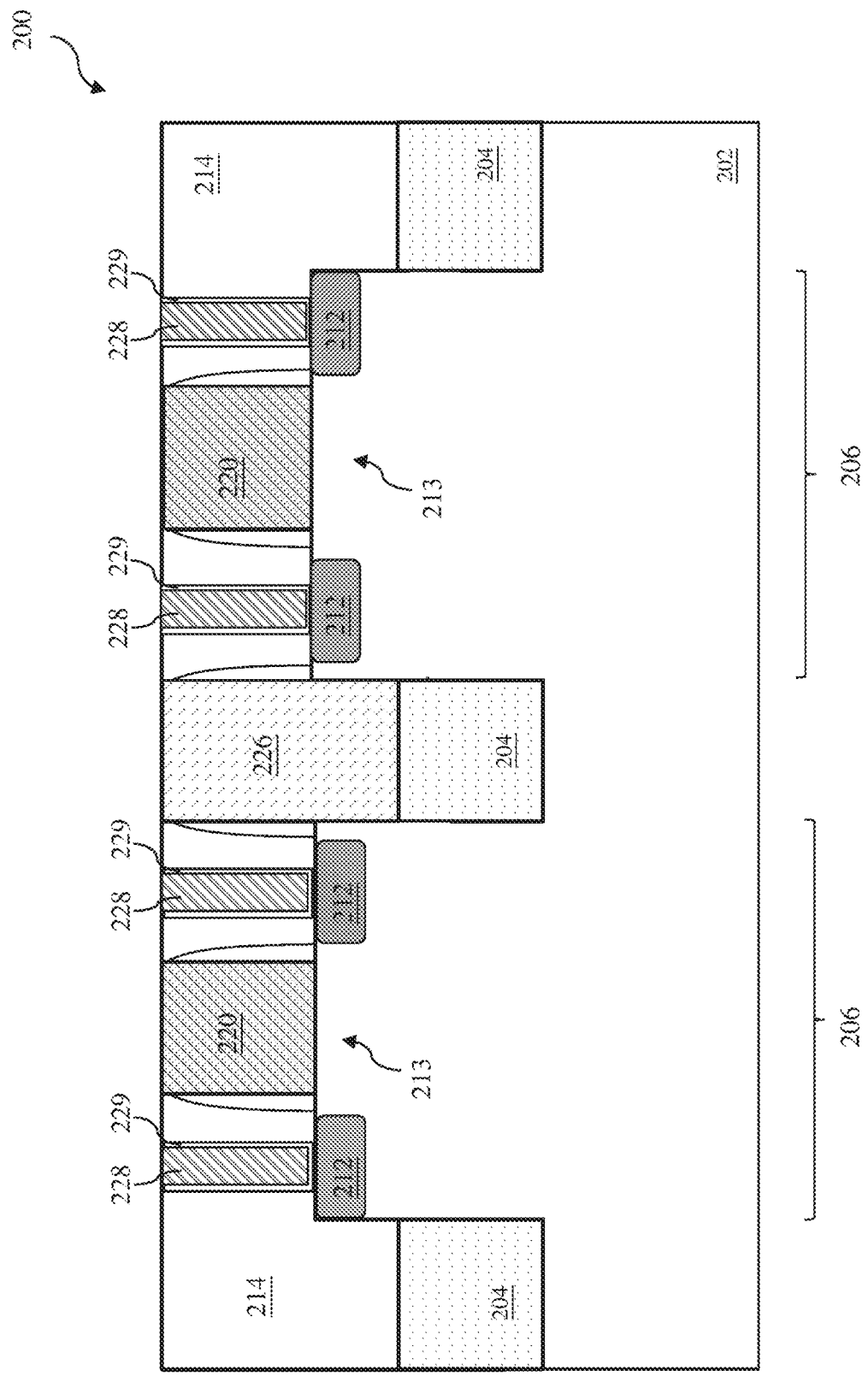

Referring to FIGS. 11A and 11B, the method 100 proceeds to an operation 120 by forming contacts 228 landing on and connecting to the source/drain features 212. The contacts 228 are conductive features electrically connect the corresponding source/drain features 212 to the overlying interconnection structure (to be formed) to form an integrated circuit. The contacts 228 include a conductive plug of a conductive material (including metal and metal alloy), such as tungsten (W), aluminum (Al), aluminum alloy, copper (Cu), cobalt (Co), other suitable metal/metal alloy, or a combination thereof. In the present embodiment, the contacts 228 further includes a barrier layer 229 lining the contact holes to enhance the material integration, such as increasing adhesion and reducing inter-diffusion. The barrier layer 229 may include more than one film. The barrier layer 229 is formed on the sidewalls and the bottom surface of the conductive plugs. In some embodiments, the barrier layer 229 includes titanium and titanium nitride (Ti/TiN), tantalum and tantalum nitride (Ta/TaN), copper silicide, or other suitable material. The formation of the contacts 228 includes depositing a barrier layer to lining the contact holes, depositing of conductive material(s) on the barrier layer within the contact holes; and performing a CMP process to remove excessive conductive material and planarize the top surface according to some embodiments. The deposition may be implemented through proper technique, such as physical vapor deposition (PVD), plating, CVD or other suitable method. Thus formed contacts 228 may have elongated shape with length to width ratio greater than 2 for reduced contact resistance and improved process window. In the present embodiment, the elongated contacts 228 are oriented in the Y direction and at least some are interposed between the high-k metal gate stacks 220 and the dielectric gate 226.

Figure 12A:
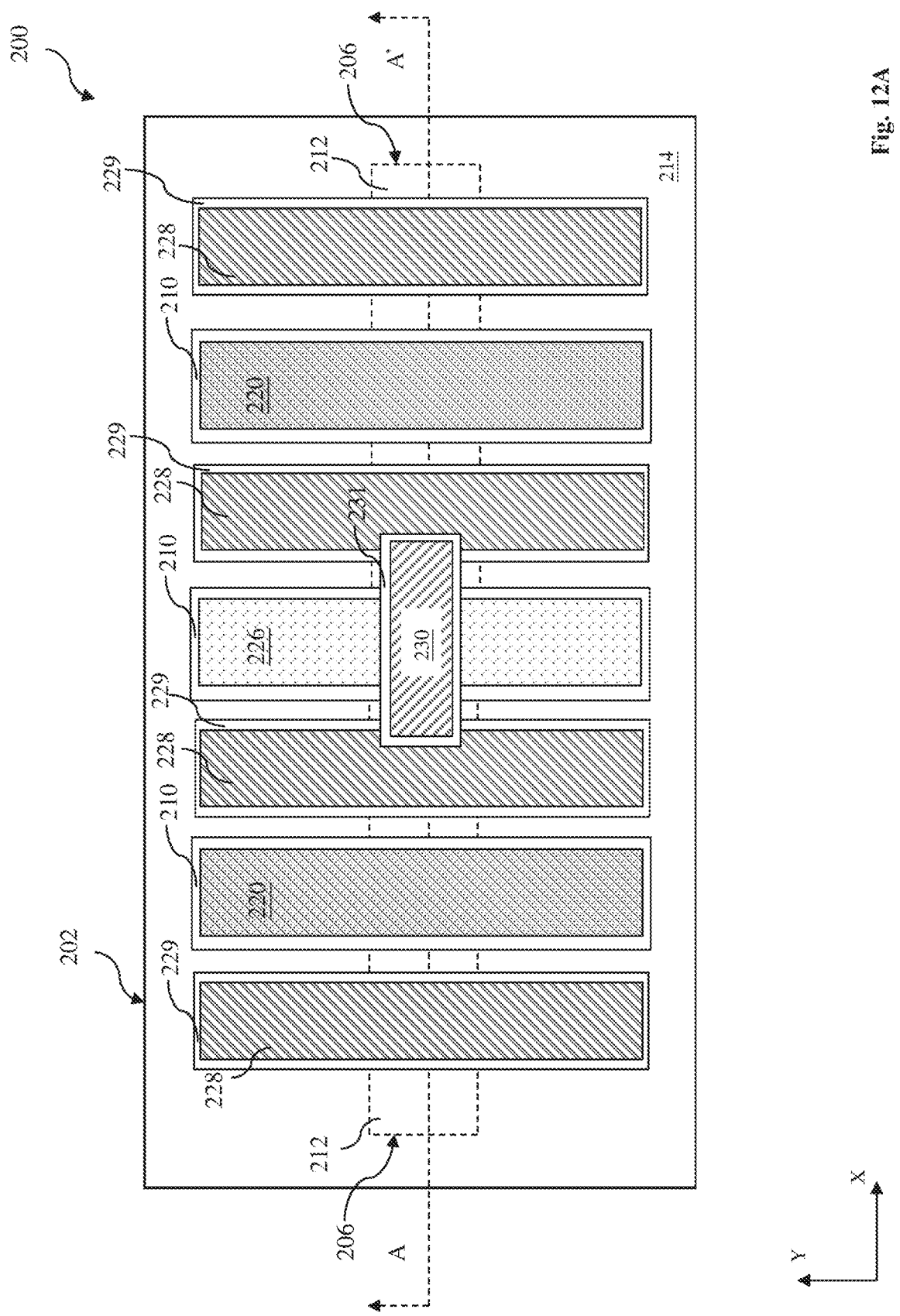
Figure 12B:
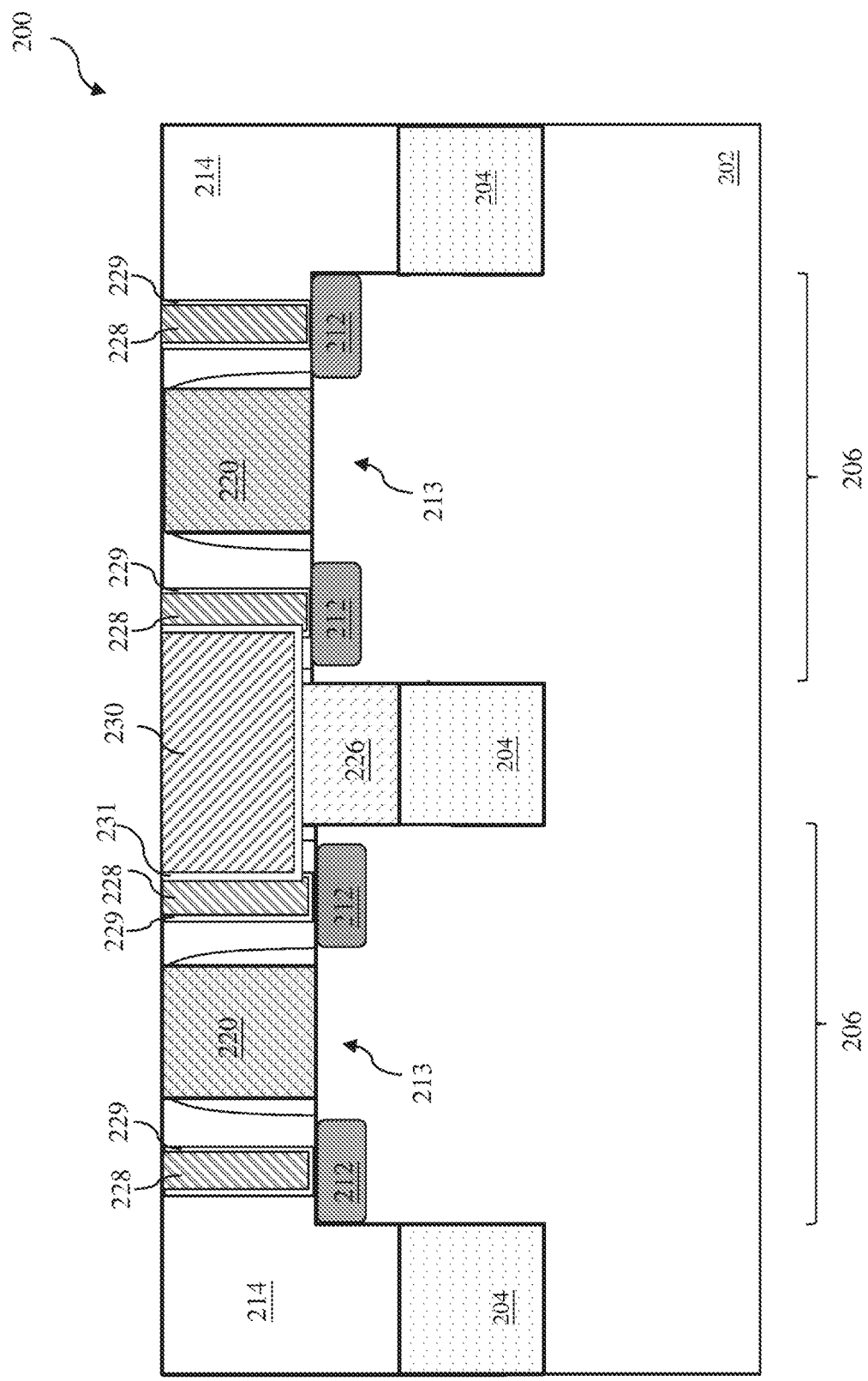

Referring to FIGS. 12A and 12B, the method 100 proceeds to an operation 122 by forming a local interconnection feature 230 landing on and connecting to the two contacts 228 on opposite sides of the dielectric gate 226. The local interconnection feature 230 provides an electrical connection between two contacts 228 on the opposite sides of the dielectric gate 226, thereby coupling the source/drain features 212 (of field-effect transistors, such as in logic circuit or memory cells, at lower interconnection level with improved device performance, enlarged processing window, and relaxed design rules. The local interconnection feature 230 is a conductive feature electrically connecting the corresponding source/drain features 212 through the contacts 228. The local interconnection feature 230 and the contacts 228 are collectively referred to as a contact feature.

The local interconnection feature 230 includes a conductive plug of a conductive material, such as W, Al, Cu, Co, other suitable metal, other suitable metal alloy, or a combination thereof. In the present embodiment, the local interconnection feature 230 further includes a barrier layer 232 lining the corresponding on sidewalls and bottom surface of the contact plug to enhance the material integration. The barrier layer 229 may include more than one film. In some embodiments, the barrier layer 231 includes at least one of Ti, Ta, and copper silicide. In some embodiments, the barrier layer 231 includes Ti/TiN, Ta/TaN, copper silicide, or other suitable material. The formation of the contacts 228 includes depositing a barrier layer to lining the contact holes, depositing of conductive material(s) on the barrier layer 231; and performing a CMP process to remove excessive conductive material and to planarize the top surface according to some embodiments.

The formation of the local interconnection feature 230 includes patterning the ILD layer 214 to form a trench to expose the contacts 228; and deposition of conductive material(s) in the trench; and CMP to remove excessive conductive material and planarize the top surface according to some embodiments. The patterning includes lithography process and etching, and may further use a hard mask for patterning. For example, the hard mask is formed on the ILD layer 214 with an opening that defines a region to form the local interconnection feature 230. The opening exposes the corresponding dielectric gate 226 and may partially expose the contacts 228 to ensure proper contacting and coupling. The etching process removes the ILD layer 214, partially removes the dielectric gate 226 within the opening, and may partially remove the contacts 228 within the opening, resulting in the trench in the ILD layer 214. Within the trench, the sidewalls of the two contact features are exposed. The deposition may include PVD, plating, CVD, other suitable method, or a combination thereof. By the deposition, the trench is filled with one or more suitable conductive material, such as W, Al, Cu, Ti, Ta, Co, or a combination thereof. Thus formed local interconnection feature 230 has an elongated shape with length to width ratio greater than 2 and is oriented along the X direction to effectively connect the two contacts 228 on the opposite sides of the dielectric gate 226. The dielectric gate 226 partially removed during the etching process but the portion underlying the local interconnection feature 230 remains as illustrated in the FIG. 12B. In the present embodiment, the local interconnection feature 230 and the contacts 228 corresponding top surfaces being coplanar with each other.

In some embodiments, the local interconnection feature 230 and the contacts 228 are different in composition. For example, the contacts 228 include tungsten and the local interconnection feature 230 includes copper, having advantages that tungsten is better to fill the contact holes with high aspect ratio while copper has a higher conductivity. In some embodiments, the local interconnection feature 230 and the contacts 228 have same composition, such as tungsten or copper.

In some embodiments, various dielectric materials are chosen to be different with considerations that include dielectric constant, etching selectivity and fabrication integration. For example, the gate dielectric layer of the metal gate stacks 220 includes a high k dielectric material; the dielectric gates 226 include silicon nitride; and the isolation features 204 include silicon oxide.

Referring to FIG. 13, the method 100 proceeds to an operation 124 by forming a multiple layer interconnection (MLI) structure 250 on the semiconductor structure 200. The MLI structure 250 includes various conductive features to couple the various device features (such as the metal gate stacks 220 and the source/drain features) to form a functional circuit. Particularly, the MLI structure 250 includes multiple metal layers to provide horizontal electrical routing and vias to provide vertical electrical routing. The MLI structure 250 also includes multiple ILD layers 252 to isolate various conductive features from each other. The ILD layer 214, as the first ILD layer underlying the multiple ILD layers 252, may be same or different from the multiple ILD layers 242 in composition. For example, the Multiple ILD layers 252 may include low-k dielectric material or other suitable dielectric materials, such as silicon oxide. As an example for illustration, the MLI structure 250 includes a first metal layer 254, a second metal layer 258 over the first metal layer 254 and a third metal layer 262 over the second metal layer 258. Each metal layer includes a plurality of metal lines. The MLI structure 250 further includes first via features 256 to provide vertical connections between the first metal lines of the first metal layer 254 and the second metal lines of the second metal layer 258; and second via features 260 to provide vertical connections between the second metal lines of the second metal layer 258 and the third metal lines of the third metal layer 262. Particularly, the MLI structure 250 is formed on both the local interconnection feature 230 and the contacts 228; and is further coupled to the corresponding source/drain features 212 through the local interconnection feature 230 and the contacts 228. More specifically, the first metal layer 254 is disposed above the local interconnection feature 230 and the contacts 228. The first metal layer 254 includes a plurality of first metal lines having one landing on the local interconnection feature 230.

In various embodiments, the conductive features (such as metal lines and vias) of the MLI structure 250 includes aluminum, copper, aluminum/silicon/copper alloy, titanium, titanium nitride, tungsten, polysilicon, metal silicide, or combinations. The MLI structure 250 may use aluminum interconnection formed by deposition and etching, or copper interconnection formed by damascene process. Those are further described below.

In the aluminum interconnection, the conductive features include aluminum, such as aluminum/silicon/copper alloy. The formation of the aluminum conductive features includes deposition, and patterning process to the deposited aluminum layer. The deposition may include physical vapor deposition (PVD), other suitable deposition, or combinations thereof. The patterning process may include a lithography process to form a patterned photoresist layer and an etching process to etch the deposited aluminum layer using the patterned photoresist layer as an etch mask. In some embodiments, a hard mask may be further used in the patterning process. The conductive features may further include barrier layers similar to the barrier layers used for the local interconnection features 230 and the contacts 228 in terms of formation and composition.

In the copper interconnection, the conductive features include copper and may further include a barrier layer. The copper interconnect structure is formed by a damascene process. A damascene process includes depositing an ILD layer; patterning the ILD layer to form trenches; depositing various conductive materials (such as a barrier layer and copper); and performing a CMP process. AA damascene process may be a single damascene process or a dual damascene process. The deposition of the copper may include PVD to form a seed layer and plating to form bulk copper on the copper seed layer.

Other fabrication operations may be implemented before, during and after the operations of the method. Some operations may be implemented by an alternative operation. For example, a patterning process may be implemented through double patterning or multiple patterning. In some embodiments, prior to the filling in the conductive material in the contact holes, silicide may be formed on the source/drain features 212 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal.

Other structure may be achieved within the scope of the present disclosure. In some embodiments, as illustrated in FIG. 14 of the sectional view of the semiconductor structure 200, the dielectric gates 226 are formed on the edges of the fin active regions 206. Especially, the dielectric gates 226 are partially landing on the STI features 204 and partially landing on the fin active regions 206 to provide robust isolation to the fin active regions and the devices formed thereon.

Figure 17:
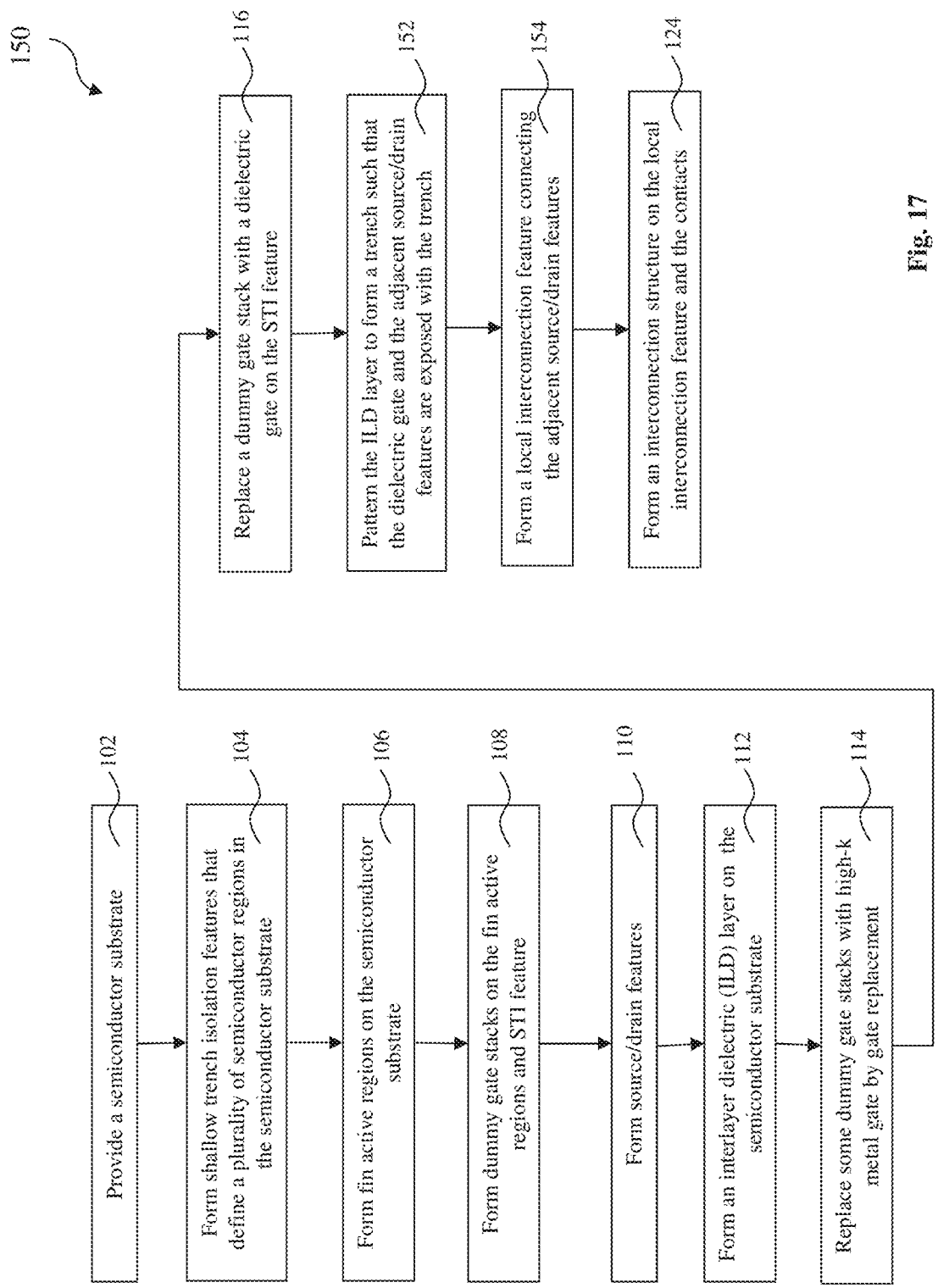
FIG. 17 is a flowchart of a method making a semiconductor constructed according to various aspects of the present disclosure in some embodiments.

In some other embodiments, the semiconductor structure 200 may be formed by another method 150 illustrated in FIG. 17. The method 150 is similar to the method 100. Those similar operations are not described here. In the method 150, the contacts 228 and the local interconnection feature 230 are collectively formed by operations 152 and 154.

Figure 18:
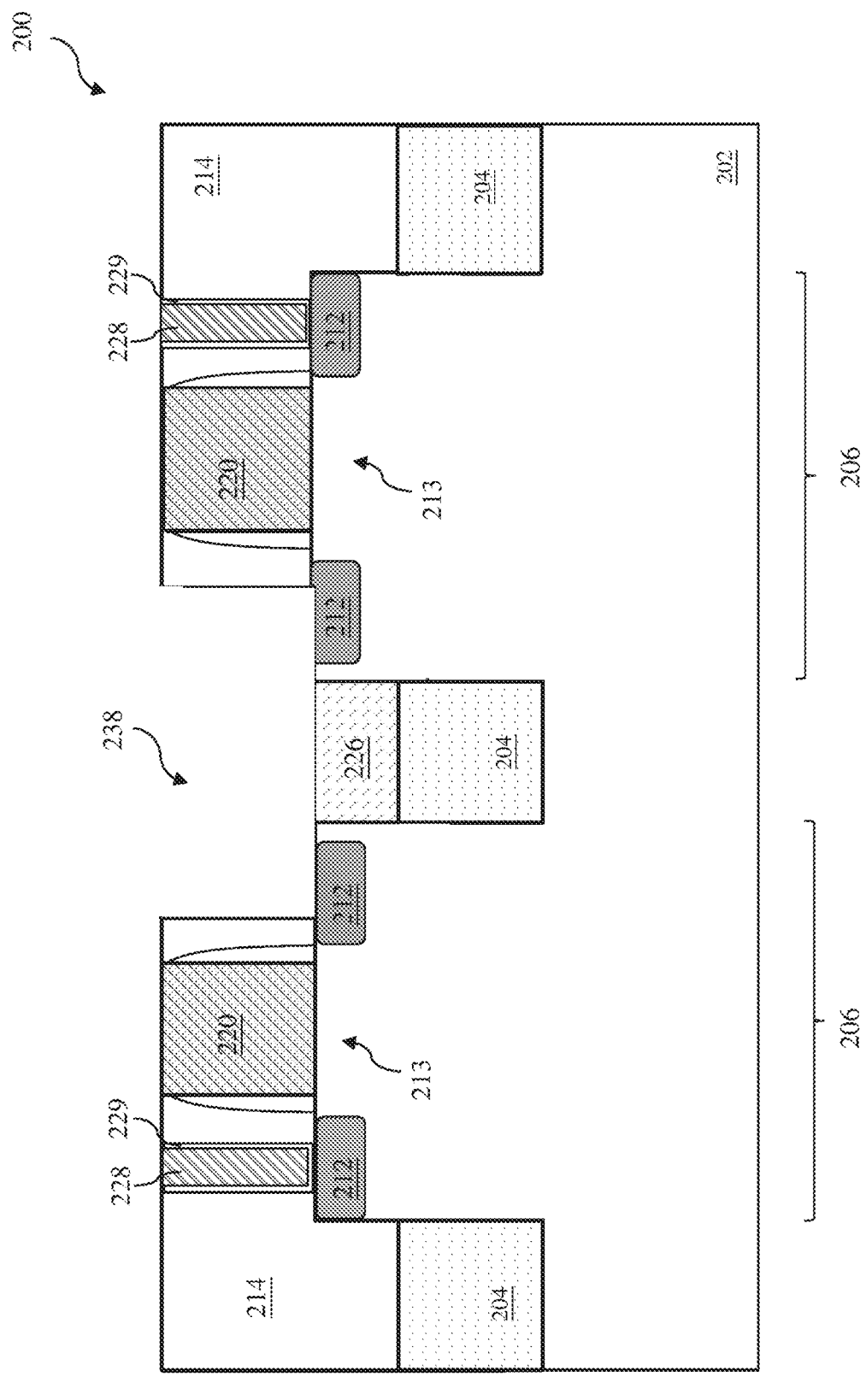
FIGS. 18 and 19 are sectional views of the semiconductor structure at various fabrication stages constructed according to some embodiments.

Referring to FIG. 18, the method 150 includes an operation 152 by patterning to form a trench 238 in the ILD layer 214 such that the two source/drain features 212 on the opposite the dielectric gate 226 are exposed within the trench 238.

Figure 19:
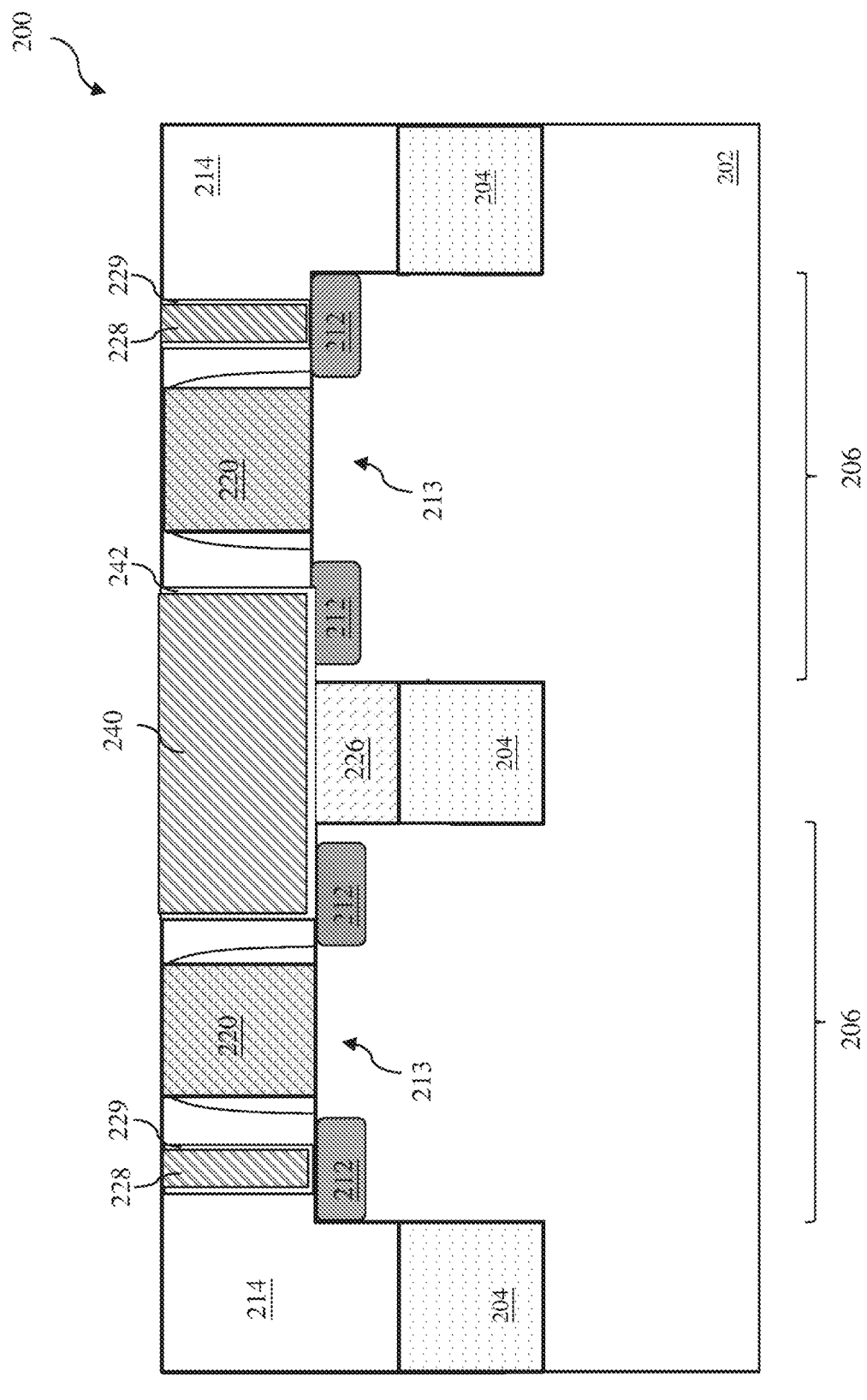

Referring to FIG. 19, the method 150 includes an operation 154 by depositing to fill the trench 238 to form a contact feature 240 with a proper conductive material, such as copper, tungsten, aluminum, silicide, other suitable conductive material or a combination thereof. In some embodiments, a barrier layer 242 is first deposited in the trench 238 for lining the trench. A CMP process is afterward applied to remove the conductive materials formed on the ILD layer 214.

Figure 20:
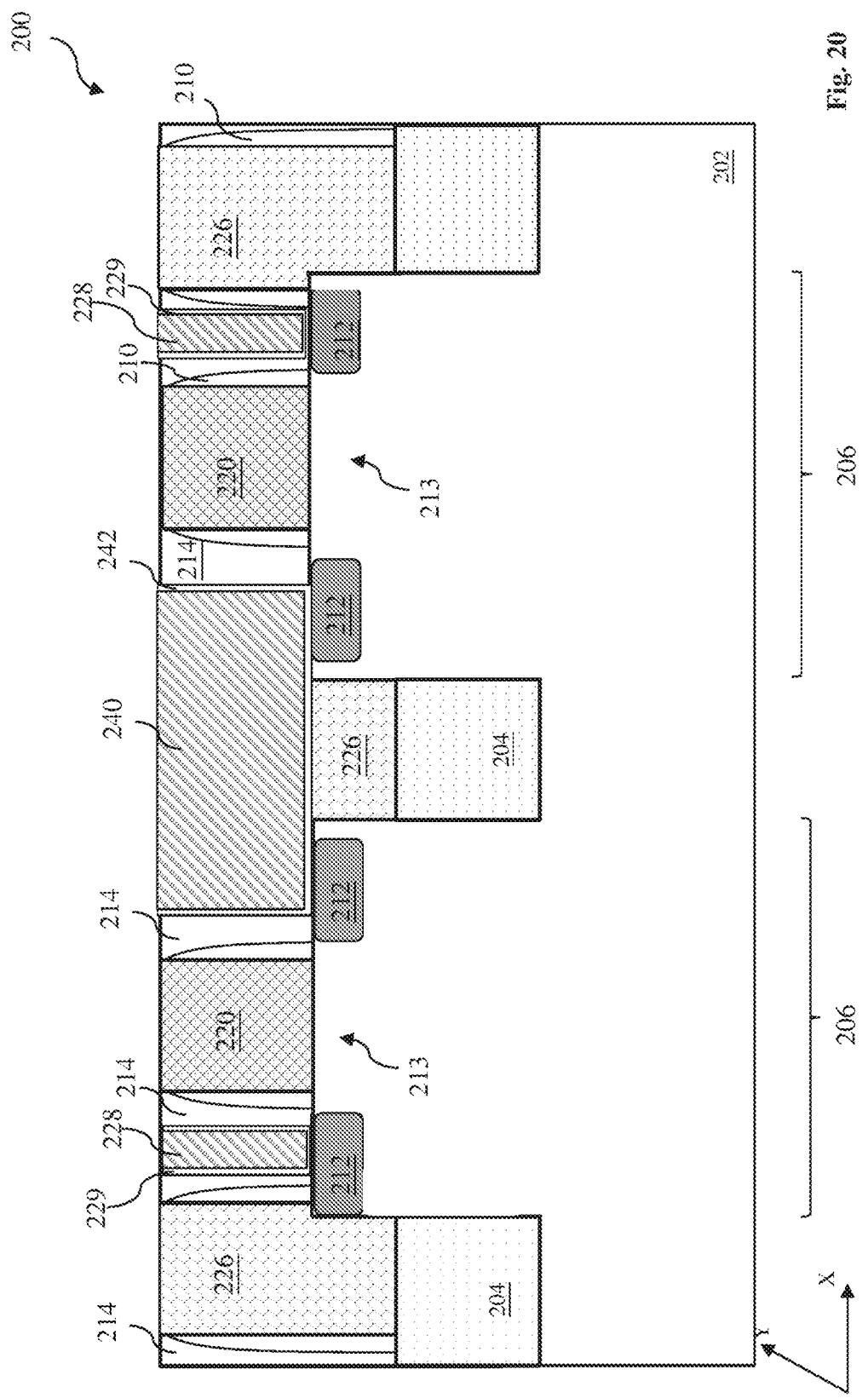
FIG. 20 is a sectional view of the semiconductor structure constructed according to some embodiments.

Similarly, additional dielectric gates 226 may be formed on the edges of the fin active regions 206 as illustrated in FIG. 20 according to some embodiments.

Figure 21:
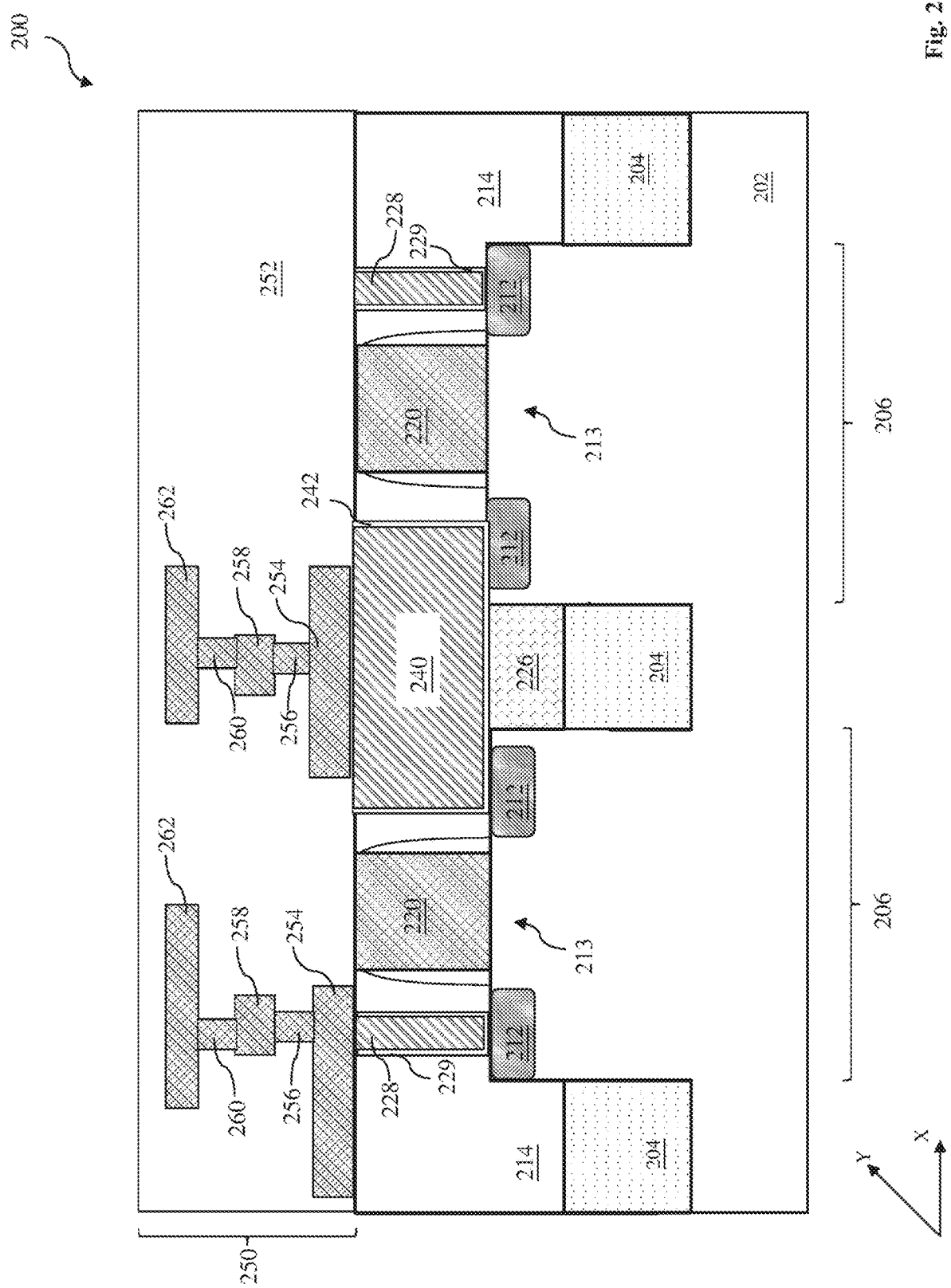
FIG. 21 is a sectional view of the semiconductor structure constructed according to some embodiments.

Referring to FIG. 21, the method 150 proceeds to an operation 124 form the interconnection structure 250 on the semiconductor structure 100.

The present disclosure provides a local interconnection feature and the method making the same in accordance with various embodiments. The local interconnection feature, with the contact features, provides a local interconnection to couple the source/drain features from the adjacent the field-effect transistors separated by the dielectric gate. Thus formed local interconnection feature has an elongated shape and extends from one contact feature associated with a first FET and another contact feature associated with a second FET. The two FETs are interposed by a dielectric gate. The dielectric gate and the underlying STI feature provide effective isolation to the two FETs. Various advantages may present in some embodiments. For example, the disclosed structure and method are compatible with the existing IC structure and method. In the previous method, the local interconnection feature to couple the adjacent source/drain features are formed in the metal layers, such as in the first metal layer, which costs more routing area. By using the disclosed method and structure, the source/drain coupling is achieved by the local interconnection feature at the lower interconnection level, the circuit density is enhanced. The structure and method may be used to form logic circuits (such as logic circuits, such as NOR, NAND, or Inverter) or memory cells (such as static random access memory (SRAM)).

Thus, the present disclosure provides a semiconductor structure in accordance with some embodiments. The semiconductor structure includes a first active region and a second fin active region extruded from a semiconductor substrate; an isolation feature formed in the semiconductor substrate and being interposed between the first and second fin active regions; a dielectric gate disposed on the isolation feature; a first gate stack disposed on the first fin active region and a second gate stack disposed on the second fin active region; a first source/drain feature formed in the first fin active region and interposed between the first gate stack and the dielectric gate; a second source/drain feature formed in the second fin active region and interposed between the second gate stack and the dielectric gate; and a contact feature formed in a first inter-level dielectric material layer and landing on the first and second source/drain features and extending over the dielectric gate.

The present disclosure provides a semiconductor structure in accordance with some other embodiments. The semiconductor structure includes a first and a second fin active region extruded from a semiconductor substrate, orienting along a first direction and adjoined by an isolation feature; a first gate stack and a second gate stack each disposed on the first and second fin active regions, respectively; a dielectric gate landing on the isolation feature, wherein the first and second gate stacks and the dielectric gate are oriented along a second direction that is orthogonal to the first direction; a first source/drain feature formed in the first fin active region and interposed between the first gate stack and the dielectric gate; a second source/drain feature formed in the second fin active region and interposed between the second gate stack and the dielectric gate; a contact feature extending along the first direction and landing on the first and second source/drain features; and an interconnection structure that further includes a first metal layer with multiple metal lines disposed above the contact feature.

The present disclosure provides a method forming an integrated circuit structure in accordance with some embodiments. The method includes forming a first and a second fin active region on a semiconductor substrate, wherein the first and second fin active regions are interposed by a shallow trench isolation (STI) feature; forming a first, a second and a third dummy gate landing on the first fin active region, the STI feature, and the second fin active region, respectively; forming a first source/drain feature on the first fin active region between the first dummy gate and the second dummy gate, and a second source/drain feature on the second fin active region between the second dummy gate and the third dummy gate; forming an inter-layer dielectric (ILD) layer on the semiconductor substrate; replacing the first and third dummy gates with a first metal gate and a second metal gate, respectively; replacing the second dummy gate with a dielectric gate; patterning the ILD layer to form a first and a second trench to expose the first and second source/drain features, respectively; forming a first and a second conductive feature in the first and second trenches, respectively; forming a third conductive feature contacting the first and second conductive features; and forming an interconnection structure that further includes a first metal layer with multiple metal lines that are disposed above the first and conductive features and the local interconnection feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a first fin feature and a second fin feature over a substrate, wherein a dielectric isolation structure is disposed over the substrate and a first portion of the dielectric isolation structure extends from the first fin feature to the second fin feature;
    forming a first gate stack directly on the first fin structure and forming a second gate stack directly on the first portion of the dielectric isolation structure;
    removing a portion of the first gate stack to form a first trench;
    forming a gate electrode layer in the first trench;
    removing a portion of the second gate stack to form a second trench, wherein the first portion of the dielectric isolation structure is exposed within the second trench; and
    forming a dielectric material in the second trench such that the second trench is completely filled with the dielectric material.

2. The method of claim 1, wherein a portion of the first fin feature is exposed within the first trench after the removing of the portion of the first gate stack to form the first trench.

3. The method of claim 1, further comprising forming a gate dielectric on the exposed portion of the first fin feature, and
    wherein the forming of the gate electrode layer in the first trench includes forming the gate electrode layer on the gate dielectric.

4. The method of claim 1, wherein the dielectric material is formed of a different composition than the dielectric isolation structure.

5. The method of claim 1, further comprising forming a third gate stack on the second fin feature, wherein the third gate stack extend to the dielectric isolation structure disposed on the substrate.

6. The method of claim 5, wherein the removing of the portion of the second gate stack to form the second trench includes removing a portion of the third gate stack to form a third trench, wherein a second portion of the dielectric isolation structure is exposed by the third trench, and
    wherein the forming of the dielectric material in the second trench includes forming the dielectric material in third trench such that the third trench is completely filled with the dielectric material.

7. The method of claim 1, further comprising:
    forming a source/drain feature on the first fin feature;
    forming a contact feature extending from the source/drain feature; and
    removing a first portion of the dielectric material, wherein a second portion of the dielectric material remains after the removing of the first portion; and
    forming an interconnect feature directly on the second portion of the dielectric material and the contact feature.

8. A method comprising:
    forming a dielectric isolation structure over a substrate;
    forming a first fin active region and a second fin active region over the substrate;
    forming a first gate stack over the first fin active region and a second gate stack over a first portion of the dielectric isolation structure, the first gate stack including a first dielectric layer and a first gate electrode layer and the second gate stack includes a second dielectric layer and a second gate electrode layer;
    removing the first dielectric layer and the first gate electrode layer to form a first trench, wherein a first portion of the fin active region is exposed within the first trench;
    forming a third dielectric layer and a third gate electrode layer in the first trench;
    removing the second dielectric layer and the second gate electrode layer to form a second trench, wherein the first portion of the dielectric isolation structure is exposed within the second trench; and
    forming a dielectric material in the second trench directly on the first portion of the dielectric isolation structure such that the dielectric material completely fills the second trench.

9. The method of claim 8, further comprising:
    forming a first source/drain feature in the first fin active region and a second source/drain feature in the second fin active region;
    forming an interlayer dielectric layer over the first and second source/drain features;
    removing a first portion of the dielectric material and a portion of the interlayer dielectric layer to expose the first and second source/drain features; and
    forming a contact on the exposed first and second source/drain features.

10. The method of claim 9, wherein a second portion of the dielectric material remains disposed over the first portion of the dielectric isolation feature after the removing of the first portion of the dielectric material.

11. The method of claim 9, wherein a top surface of the first fin active region and top surface of the second portion of the dielectric material are at the same level.

12. The method of claim 8, wherein forming the second gate stack over a first portion of the dielectric isolation structure includes forming the second gate stack over the second fin active region.

13. The method of claim 12, wherein a sidewall spacer of the second gate stack is disposed over a top surface of the second fin active region.

14. The method of claim 8, further comprising forming a source/drain feature on the first fin active region prior to the removing of the first dielectric layer and the first gate electrode layer to form the first trench.

15. The method of claim 8, wherein the dielectric material is formed of a different material than the dielectric isolation structure.

16. A method of forming an integrated circuit structure, the method comprising:
    forming a first and a second fin active region on a semiconductor substrate, wherein the first and second fin active regions are interposed by a shallow trench isolation (STI) feature;
    forming a first, a second and a third dummy gate landing on the first fin active region, the STI feature, and the second fin active region, respectively;
    forming a first source/drain feature on the first fin active region between the first dummy gate and the second dummy gate, and a second source/drain feature on the second fin active region between the second dummy gate and the third dummy gate;

forming an inter-layer dielectric (ILD) layer on the semiconductor substrate;

replacing the first and third dummy gates with a first metal gate and a second metal gate, respectively;

replacing the second dummy gate with a dielectric gate;

patterning the ILD layer to form a first and a second trench to expose the first and second source/drain features, respectively;

forming a first and a second conductive feature in the first and second trenches, respectively;

forming a local interconnection feature contacting the first and second conductive features; and forming an interconnection structure that further includes a first metal layer with multiple metal lines that are disposed above the first and conductive features and the local interconnection feature.

17. The method of claim 16, wherein the forming of a first, a second and a third dummy gate includes depositing a dummy gate material and patterning the dummy gate material, thereby forming the first, the second and the third dummy gates;

the replacing of the first and third dummy gates with a first metal gate and a second metal gate, respectively includes removing the first and third dummy to form a third trench and a fourth trench, filling the third and fourth trenches with a metal electrode, and performing a first chemical mechanical polishing (CMP) process; and the replacing of the second dummy gate with a dielectric gate includes removing the second dummy gate to form a fifth trench, filling the fifth trench with a dielectric material, and performing a second CMP process.

18. The method of claim 17, wherein the forming of a local interconnection feature contacting the first and second conductive features includes patterning the ILD layer to form a sixth trench, filling the sixth trench with a conductive material, and performing a second CMP process, causing the first and conductive features and the local interconnection feature to have a coplanar top surface.

19. The method of claim 18, wherein the patterning the ILD to form a sixth trench includes etching the ILD layer and the dielectric gate to form the sixth trench that exposes the first and second conductive features.

20. The method of claim 15, wherein the dielectric gate interfaces with the STI.

* * * * *